(12) United States Patent
Ono et al.

(10) Patent No.: US 6,903,345 B2
(45) Date of Patent: Jun. 7, 2005

(54) ELECTRON OPTICAL SYSTEM, CHARGED-PARTICLE BEAM EXPOSURE APPARATUS USING THE SAME, AND DEVICE MANUFACTURING METHOD

(75) Inventors: Haruhito Ono, Kanagawa (JP); Takayuki Yagi, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 386 days.

(21) Appl. No.: 09/819,907

(22) Filed: Mar. 29, 2001

(65) Prior Publication Data

US 2002/0000766 A1 Jan. 3, 2002

(30) Foreign Application Priority Data

Mar. 31, 2000 (JP) ........................................ 2000-097125

(51) Int. Cl.[7] ............................ G21K 1/08; H01J 49/00
(52) U.S. Cl. ....................... 250/396 R; 250/396 ML; 250/492.1; 250/492.2; 250/492.21; 250/492.22; 250/398
(58) Field of Search .................... 250/396 R, 396 ML, 250/398, 492.1, 492.2, 192.21, 492.22, 492.23, 492.3, 493.1, 505.1

(56) References Cited

U.S. PATENT DOCUMENTS

| 4,200,794 A | * | 4/1980 | Newberry et al. ... 250/396 ML |
| 4,354,111 A | | 10/1982 | Williams et al. ........ 250/396 R |
| 4,419,182 A | | 12/1983 | Westerberg et al. ........ 156/644 |
| 4,419,580 A | | 12/1983 | Walker et al. .......... 250/396 R |
| 4,569,033 A | * | 2/1986 | Collins et al. .............. 708/839 |
| 4,607,167 A | | 8/1986 | Petric ....................... 250/492.2 |
| 4,742,234 A | | 5/1988 | Feldman et al. ......... 250/492.2 |
| 5,105,089 A | * | 4/1992 | Yamada .................... 250/492.2 |
| 5,121,234 A | | 6/1992 | Kucera ......................... 359/50 |
| 5,215,623 A | | 6/1993 | Takahashi et al. .......... 156/644 |
| 5,260,579 A | | 11/1993 | Yasuda et al. ............ 250/492.2 |
| 5,324,930 A | | 6/1994 | Jech, Jr. ...................... 250/216 |
| 5,534,311 A | | 7/1996 | Shaw et al. ................. 427/526 |
| 5,604,394 A | | 2/1997 | Saito et al. ................. 313/422 |
| 5,617,131 A | | 4/1997 | Murano et al. ............. 347/233 |
| 5,731,591 A | * | 3/1998 | Yamada et al. .......... 250/492.2 |

(Continued)

FOREIGN PATENT DOCUMENTS

| JP | 56-19402 | 5/1981 |
| JP | 6-44093 | 2/1994 |
| JP | 2001-126651 | 5/2001 |

OTHER PUBLICATIONS

"Sub-Nanometer Miniature Electron Microscope", A.D. Feinerman, et al., Journal of Vacuum Science and Technology A, vol. 10, No. 4, Jul./Aug. 1992, 611–616.

(Continued)

Primary Examiner—John R. Lee
Assistant Examiner—David A. Vanore
(74) Attorney, Agent, or Firm—Fitzpatrick, Cella, Harper & Scinto

(57) ABSTRACT

An electron optical system has a plurality of electron lenses. The system includes a first electron optical system array having electrodes with a plurality of rectangular apertures, and a second electron optical system array having electrodes with a plurality of rectangular apertures. The first and second electron optical system arrays are arranged along an optical axis in which a long side of each aperture of the first electron optical system array is perpendicular to a long side of each aperture of the second electron optical system array.

19 Claims, 17 Drawing Sheets

U.S. PATENT DOCUMENTS

| | | | |
|---|---|---|---|
| 5,834,783 A | 11/1998 | Muraki et al. | 250/398 |
| 5,864,142 A | 1/1999 | Muraki et al. | 250/491.1 |
| 5,905,267 A | 5/1999 | Muraki | 250/492.22 |
| 5,929,454 A | 7/1999 | Muraki et al. | 250/491.1 |
| 5,939,725 A | 8/1999 | Muraki | 250/492.22 |
| 5,942,761 A | 8/1999 | Tuli | 250/556 |
| 5,973,332 A * | 10/1999 | Muraki et al. | 250/492.2 |
| 5,981,954 A | 11/1999 | Muraki | 250/397 |
| 6,014,200 A * | 1/2000 | Sogard et al. | 355/53 |
| 6,072,251 A | 6/2000 | Markle | 310/12 |
| 6,104,035 A | 8/2000 | Muraki | 250/492.22 |
| 6,107,636 A | 8/2000 | Muraki | 250/492.2 |
| 6,121,625 A * | 9/2000 | Ito et al. | 250/492.22 |
| 6,137,103 A | 10/2000 | Giles et al. | 250/216 |
| 6,137,113 A | 10/2000 | Muraki | 250/492.22 |
| 6,166,387 A | 12/2000 | Muraki et al. | 250/492.2 |
| 6,184,850 B1 | 2/2001 | Suzuki et al. | 345/74 |
| 6,188,074 B1 | 2/2001 | Satoh et al. | 250/492.22 |
| 6,274,877 B1 | 8/2001 | Muraki | 250/492.23 |
| 6,323,499 B1 * | 11/2001 | Muraki et al. | 250/492.22 |
| 6,337,485 B1 | 1/2002 | Muraki et al. | 250/492.2 |
| 6,381,072 B1 | 4/2002 | Burger | 713/500 |
| 6,465,796 B1 * | 10/2002 | Haraguchi et al. | 250/492.23 |
| 6,469,799 B1 | 10/2002 | Kajita | 358/1.16 |
| 6,472,672 B1 | 10/2002 | Muraki | 250/492.2 |
| 6,483,120 B1 | 11/2002 | Yui et al. | 250/491.1 |
| 6,515,409 B2 | 2/2003 | Muraki et al. | 313/359.1 |
| 6,566,664 B2 | 5/2003 | Muraki | 250/492.2 |
| 6,603,128 B2 | 8/2003 | Maehara et al. | 250/441.11 |
| 6,617,595 B1 | 9/2003 | Okunuki | 250/492.22 |
| 2001/0052576 A1 | 12/2001 | Shimada et al. | 250/492.1 |
| 2001/0054690 A1 | 12/2001 | Shimada et al. | 250/306 |
| 2002/0005491 A1 | 1/2002 | Yagi et al. | 250/396 |
| 2001/0008207 A1 | 1/2002 | Muraki et al. | 250/398 |
| 2002/0009901 A1 | 1/2002 | Maehara et al. | 438/795 |
| 2002/0051111 A1 | 5/2002 | Greene et al. | 349/149 |
| 2002/0160311 A1 | 10/2002 | Muraki et al. | 430/926 |
| 2002/0179855 A1 | 12/2002 | Muraki | 250/492.22 |
| 2003/0094584 A1 | 5/2003 | Yui et al. | 250/492.22 |
| 2003/0209673 A1 * | 11/2003 | Ono et al. | 250/396 R |
| 2004/0061064 A1 | 4/2004 | Ono et al. | 250/396 R |

OTHER PUBLICATIONS

"High Aspect Ratio Aligned Multilayer Microstructure Fabrication", K. Y. Lee, et al., Journal of Vacuum Science and Technology B, vol. 12, No. 6, Nov./Dec. 1994, pp. 3425–3430.

"Arrayed Miniature Electron Beam Columns For High Throughput Sub–100 nm Lithography", T. H. P. Chang, et al., Journal of Vacuum Science and Technology B, vol. 10, No. 6, Nov./Dec. 1992, pp. 2743–2748.

"Microstructures for Particle Beam Control", G. W. Jones, et al., Journal of Vacuum Science and Technology B, vol. 6, No. 6, Nov./Dec. 1988, pp. 2023–2027.

"A Multibeam Scheme for Electron–Beam Lithography", T. Sasaki, Journal of Vacuum Science and Technology, vol. 19, No. 4, Nov./Dec. 1981, pp. 963–965.

* cited by examiner

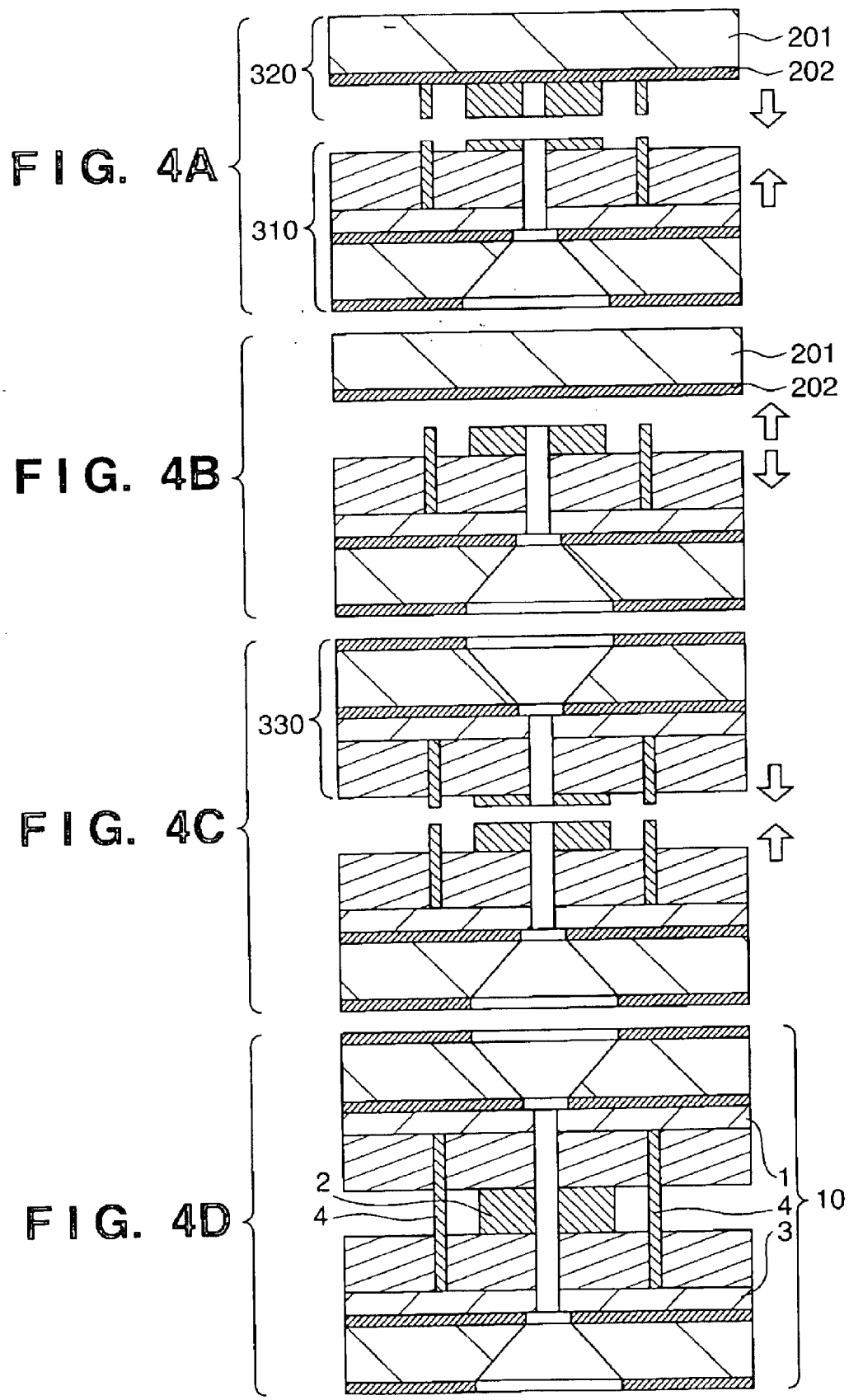

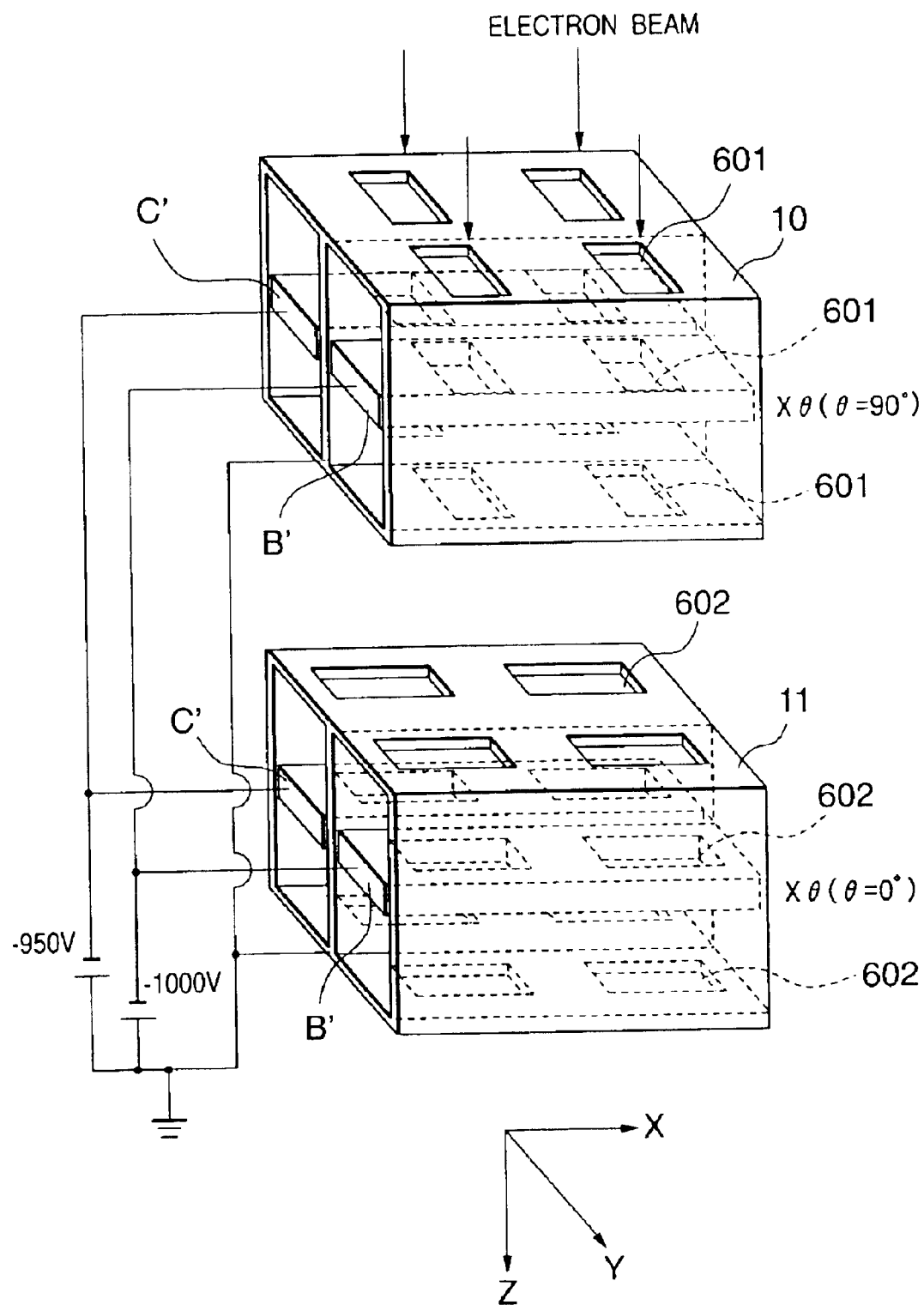

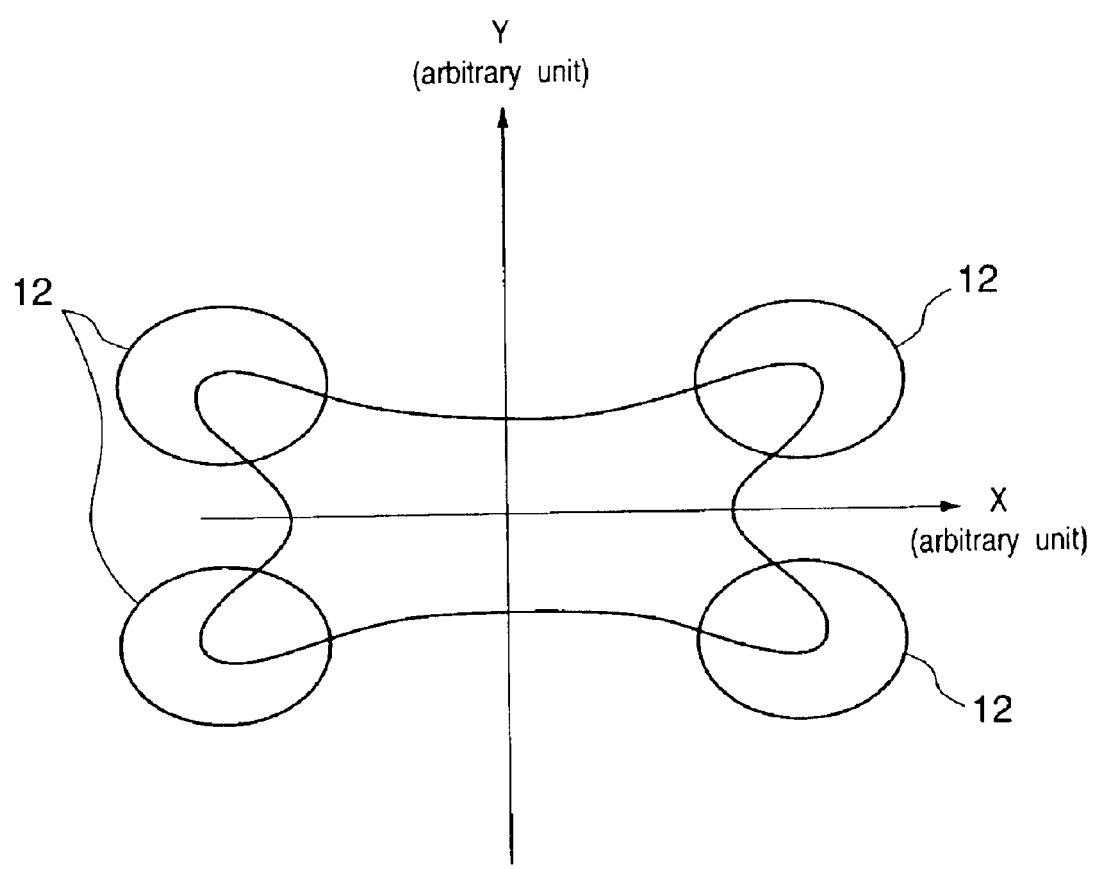

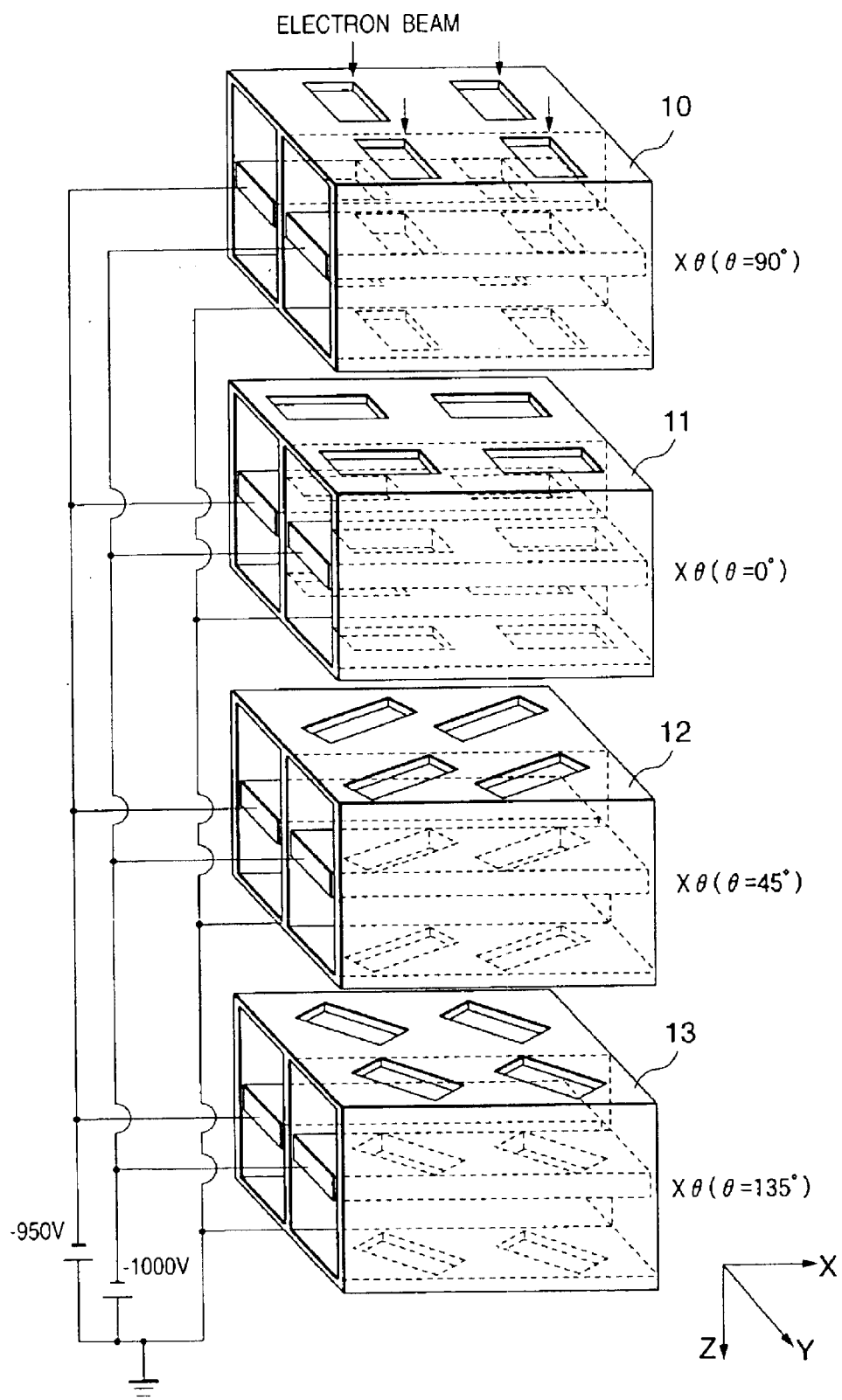

FIG. 15

```
URL  http://www.maintain.co.jp/db/input.html

TROUBLE DB INPUT WINDOW

OCCURRENCE DATE  [2000/3/15] ~4040
TYPE OF APPARATUS [**********] ~4010
SUBJECT [OPERATING ERROR (START-UP ERROR)] ~4030
SERIAL NUMBER S/N [465NS4580001] ~4020
DEGREE OF URGENCY [D] ~4050
SYMPTOM  [LED IS KEPT FLICKERING AFTER
          POWER-ON]                         ~4060

REMEDY   [POWER ON AGAIN
          (PRESS RED BUTTON IN ACTIVATION)] ~4070

PROGRESS [INTERIM HAS BEEN DONE]            ~4080

(SEND)(RESET)      4100             4110              4120
LINK TO RESULT LIST DATABASE   SOFTWARE LIBRARY   OPERATING GUIDE
```

ELECTRON OPTICAL SYSTEM, CHARGED-PARTICLE BEAM EXPOSURE APPARATUS USING THE SAME, AND DEVICE MANUFACTURING METHOD

FIELD OF THE INVENTION

The present invention pertains to the technical field of an electron optical system suitable for an exposure apparatus using charged-particle beams such as electron beams, and relates to an electron optical system having an array of a plurality of electron lenses.

BACKGROUND OF THE INVENTION

In production of semiconductor devices, an electron beam exposure technique receives a great deal of attention, as a promising candidate of lithography, capable of micropattern exposure at a line width of 0.1 $\mu$m or less. There are several electron beam exposure methods. An example is a variable rectangular beam method of drawing a pattern with one stroke. This method suffers from many problems as a mass-production exposure apparatus because of a low throughput. To attain a high throughput, there is proposed a pattern projection method of reducing and transferring a pattern formed on a stencil mask. This method is advantageous to a simple repetitive pattern, but disadvantageous to a random pattern such as a logic interconnection pattern in terms of the throughput, and a low productivity disables practical application.

To the contrary, a multi-beam system for drawing a pattern simultaneously with a plurality of electron beams without using any mask has been proposed and is very advantageous for practical use because of the absence of physical mask formation and exchange. What is important in using multi-electron beams is the number of electron lenses formed in an array used in this system. The number of electron lenses determines the number of beams, and is a main factor which determines the throughput. Downsizing the electron lenses while improving the performance of them is one of the keys to improving the performance of the multi-beam exposure apparatus.

Electron lenses are classified into electromagnetic and electrostatic types. The electrostatic electron lens does not require any coil core or the like, is simpler in structure than the electromagnetic electron lens, and is more advantageous to downsizing. Principal prior art concerning downsizing of the electrostatic electron lens (electrostatic lens) will be described.

A. D. Feinerman et al. (J. Vac. Sci. Technol. A10 (4), p. 611, 1992) disclose a three-dimensional structure made up of three electrodes as a single electrostatic lens by a micromechanical technique using a V-groove formed by a fiber and Si crystal anisotropic etching. The Si film has a membrane frame, membrane, and aperture formed in the membrane so as to transmit an electron beam. K. Y. Lee et al. (J. Vac. Sci. Technol. B12 (6), p. 3,425, 1994) disclose a multilayered structure of Si and Pyrex glass fabricated by using anodic bonding. This technique fabricates microcolumn electron lenses aligned at a high precision. Sasaki (J. Vac. Sci. Technol. 19, p. 963, 1981) discloses an einzel lens made up of three electrodes having lens aperture arrays. Chang et al. (J. Vac. Sci. Technol. B10, p. 2,743, 1992) disclose an array of microcolumns having einzel lenses.

In the prior art, if many aperture electrodes are arrayed, and different lens actions are applied to electron beams, the trajectories and aberrations change under the influence of the surrounding electrostatic lens field, and so-called crosstalk occurs in which electron beams are difficult to operate independently.

Crosstalk will be explained in detail with reference to FIG. 10. Three types of electrodes, i.e., an upper electrode 1, middle electrodes 2, and a lower electrode 3 constitute an einzel lens. The upper and lower electrodes 1 and 3 are 10 $\mu$m in thickness and have 80-$\mu$m diameter apertures arrayed at a pitch of 200 $\mu$m. The middle electrodes 2 are 50 $\mu$m in thickness, have a cylindrical shape 80 $\mu$m in inner diameter, and arrayed at a pitch of 200 $\mu$m. The distances between the upper and middle electrodes 1 and 2 and between the middle and lower electrodes 2 and 3 are 100 $\mu$m. The upper and lower electrodes 1 and 3 receive a potential of 0 [V], middle electrodes 2 on central and upper lines B and A receive −1,000 [V], and middle electrodes 2 on a lower line C receive −950 [V]. The potential difference between adjacent electrodes is 50 [V]. When an electron beam having a beam diameter of 40 $\mu$m and an energy of 50 keV enters a central aperture from the left of the upper electrode 1, a downward deflection angle $\Delta\theta$ of the electron beam becomes several ten $\mu$ rad or more. A typical allowable value of the deflection angle $\Delta\theta$ is 1$\mu$ rad or less. In this electrode arrangement, the deflection angle exceeds the allowable range. That is, the electron beam is influenced by the surrounding lens field, and so-called crosstalk occurs, which must be solved.

SUMMARY OF THE INVENTION

The present invention has been made to overcome the conventional drawbacks, and has as its principal object to provide an improvement of the prior art. It is an object of the present invention to provide an electron optical system which realizes various conditions such as downsizing, high precision, and high reliability at a high level. It is another object of the present invention to provide an electron optical system improved by reducing crosstalk unique to a multi-beam. It is still another object of the present invention to provide a high-precision exposure apparatus using the electron optical system, a high-productivity device manufacturing method, a semiconductor device production factory, and the like.

According to the first aspect of the present invention, there is provided an electron optical system having a plurality of electron lenses, comprising a plurality of electrodes which have apertures for transmitting a charged-particle beam and are arranged in one plane, and a shield interposed between the adjacent electrodes. The shield is arranged, e.g., substantially parallel to an optical axis. The apertures are circular or rectangular. According to a preferred mode of the present invention, the electron optical system comprises at least two sets of the plurality of electrodes, and the at least two sets of the plurality of electrodes are arranged along an optical axis. According to another preferred mode of the present invention, each of the plurality of electrodes has a plurality of apertures, and the apertures of each electrode are aligned in an array.

According to the second aspect of the present invention, there is provided an electron optical system having a plurality of electron lenses, comprising an upper electrode having a plurality of apertures, a plurality of middle electrodes each having an aperture, a lower electrode having a plurality of apertures, and a shield interposed between the adjacent middle electrodes, wherein the upper electrode, middle electrodes, and lower electrode are arranged along an optical axis. According to a preferred mode of the present invention, the shield is electrically coupled to the upper and lower electrodes, and/or is electrically insulated from middle electrodes on two sides of the shield. According to another preferred mode of the present invention, the shield is arranged substantially parallel to the optical axis. According to still another preferred mode of the present invention, the electron optical system comprises at least two sets of the plurality of middle electrodes, and the at least two sets of the plurality of middle electrodes are arranged along the optical axis. According to still another preferred mode of the present invention, the apertures of the upper electrode, the apertures of the middle electrodes, and the apertures of the lower electrode are circular or rectangular. According to still another preferred mode of the present invention, each of the middle electrodes has a plurality of rectangular apertures, and a long side of each aperture has an angle of not less than 0° to less than 180° in a direction along which the plurality of apertures are aligned.

According to the third aspect of the present invention, there is provided an electron optical system having a plurality of electron lenses, comprising a first electron optical system array having electrodes with a plurality of rectangular apertures, and a second electron optical system array having electrodes with a plurality of rectangular apertures, the first and second electron optical system arrays being arranged along an optical axis, wherein a long side of each aperture of the first electron optical system array is perpendicular to a long side of each aperture of the second electron optical system array. According to a preferred mode of the present invention, each of the first and second electron optical system arrays comprises an upper electrode having a plurality of apertures, a plurality of middle electrodes each having an aperture, a lower electrode having a plurality of apertures, and a shield interposed between the adjacent middle electrodes.

According to the fourth aspect of the present invention, there is provided a charged-particle beam exposure apparatus comprising a charged-particle source for emitting a charged-particle beam, a first electron optical system which has a plurality of electron lenses and forms a plurality of intermediate images of the charged-particle source by the plurality of electron lenses, and a second electron optical system for projecting on a substrate the plurality of intermediate images formed by the first electron optical system. In this aspect, the first electron optical system includes a plurality of electrodes which have apertures for transmitting the charged-particle beam and are arranged in one plane, and a shield interposed between the adjacent electrodes.

According to the fifth aspect of the present invention, there is provided a charged-particle beam exposure apparatus comprising a charged-particle source for emitting a charged-particle beam, a first electron optical system which has a plurality of electron lenses and forms a plurality of intermediate images of the charged-particle source by the plurality of electron lenses, and a second electron optical system for projecting on a substrate the plurality of intermediate images formed by the first electron optical system. In this aspect, the first electron optical system includes an upper electrode having a plurality of apertures, a plurality of middle electrodes each having an aperture, a lower electrode having a plurality of apertures, and a shield interposed between the adjacent middle electrodes. The upper electrode, middle electrodes, and lower electrode are arranged along an optical axis.

According to the sixth aspect of the present invention, there is provided a charged-particle beam exposure apparatus comprising a charged-particle source for emitting a charged-particle beam, a first electron optical system which has a plurality of electron lenses and forms a plurality of intermediate images of the charged-particle source by the plurality of electron lenses, and a second electron optical system for projecting on a substrate the plurality of intermediate images formed by the first electron optical system. In this aspect, the first electron optical system includes a first electron optical system array having electrodes with a plurality of rectangular apertures, and a second electron optical system array having electrodes with a plurality of rectangular apertures, the first and second electron optical system arrays being arranged along an optical axis. A long side of each aperture of the first electron optical system array is perpendicular to a long side of each aperture of the second electron optical system array.

According to the seventh aspect of the present invention, there is provided a device manufacturing method comprising the steps of installing a plurality of semiconductor manufacturing apparatuses, including a charged-particle beam exposure apparatus, in a factory, and manufacturing a semiconductor device by using the plurality of semiconductor manufacturing apparatuses. In this aspect, the charged-particle beam exposure apparatus has a charged-particle source for emitting a charged-particle beam, a first electron optical system which has a plurality of electron lenses and forms a plurality of intermediate images of the charged-particle source by the plurality of electron lenses, and a second electron optical system for projecting on a substrate the plurality of intermediate images formed by the first electron optical system. The first electron optical system includes a plurality of electrodes which have apertures for transmitting the charged-particle beam and are arranged in one plane, and a shield interposed between the adjacent electrodes. According to a preferred mode of the present invention, the manufacturing method further comprises the steps of connecting the plurality of semiconductor manufacturing apparatuses by a local area network, connecting the local area network to an external network of the factory, acquiring information about the charged-particle beam exposure apparatus from a database on the external network by using the local area network and the external network, and controlling the charged-particle beam exposure apparatus on the basis of the acquired information.

According to the eighth aspect of the present invention, there is provided a semiconductor manufacturing factory comprising a plurality of semiconductor manufacturing apparatuses including any one of the above-described charged-particle beam exposure apparatuses, a local area network for connecting the plurality of semiconductor manufacturing apparatuses, and a gateway for connecting the local area network to an external network of the semiconductor manufacturing factory.

According to the ninth aspect of the present invention, there is provided a maintenance method for a charged-particle beam exposure apparatus, comprising the steps of preparing a database for storing information about maintenance of the charged-particle beam exposure apparatus on an external network of a factory where any one of the above-described charged-particle beam exposure apparatuses is installed, connecting the charged-particle beam exposure apparatus to a local area network in the factory, and maintaining the charged-particle beam exposure apparatus on the basis of the information stored in the database by using the external network and the local area network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 4A to 4D are sectional views for explaining a method of joining electrodes;

FIG. 6 is a perspective view showing the arrangement and electrical connection of an electron optical system according to the second embodiment;

FIG. 8 is a view showing the shape of an electron beam having passed through a rectangular aperture;

FIG. 9 is a perspective view for explaining an electron optical system according to the third embodiment;

FIG. 15 is a view showing a user interface on a display;

DETAILED DESCRIPTION OF THE PREFERRED EMBODIMENTS

<Electron Optical System Array>

Figure 1:
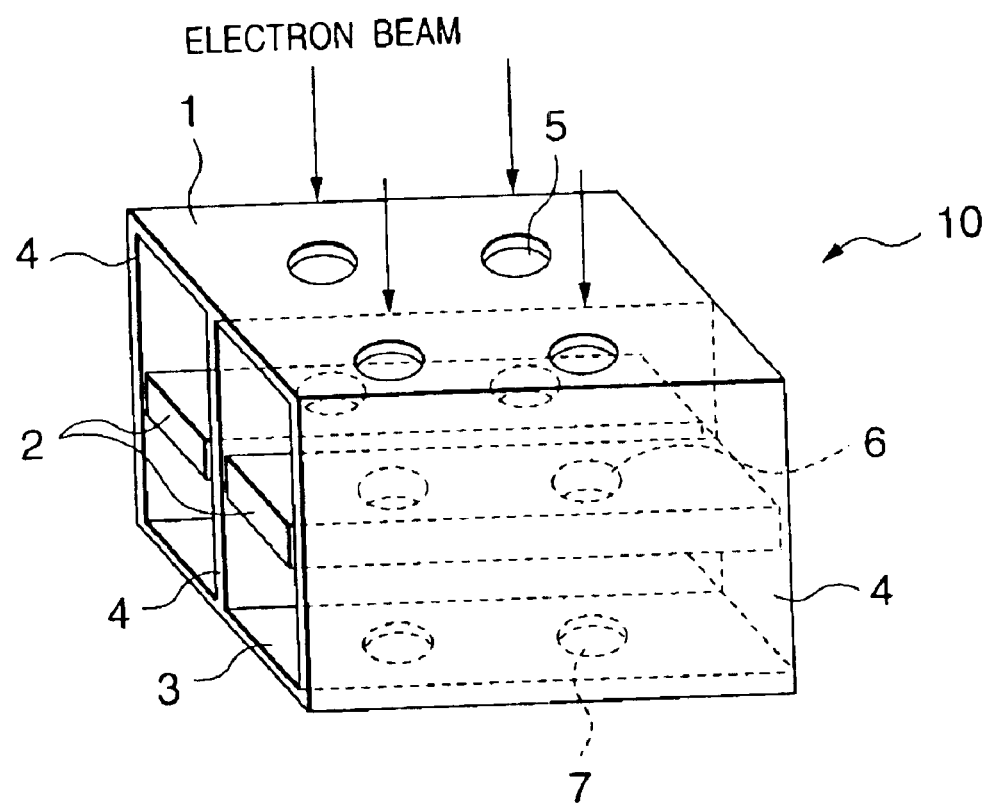
FIG. 1 is a perspective view for explaining the structure of an electron optical system array.

An electron optical system array according to the first embodiment of the present invention will be described. FIG. 1 is a perspective view showing an electron optical system array 10 having a plurality of electron lenses. In FIG. 1, the electron optical system array 10 is mainly constituted by sequentially stacking an upper electrode 1, a plurality of middle electrodes 2, and a lower electrode 3, each of which has a plurality of apertures. The electrodes 1, 2, and 3 form a so-called einzel lens. The middle electrodes 2 are aligned within one plane, and a conductive shield 4 for electromagnetically shielding the middle electrodes 2 is interposed between adjacent middle electrodes 2. The middle electrode 2 and shield 4 are spatially separated or connected via an insulator so as not to electrically connect them. The shield 4 is coupled to the upper and lower electrodes 1 and 3. The upper electrode 1 has a thin-film structure 10 μm in thickness that is formed from an electrode layer of a conductive material (e.g., Cu), and has a plurality of circular apertures 5 arrayed regularly. The lower electrode 3 also has the same structure as in the upper electrode 1, and has a plurality of apertures 7 at positions corresponding to the apertures of the upper electrode. The middle electrode 2 on each line is formed from a rectangular electrode element 50 μm in thickness. The shield 4 is made of a conductive material 2 μm in thickness. The distances between the upper and middle electrodes 1 and 2 and between the middle and lower electrodes 2 and 3 are 100 μm, the aperture diameter of each electrode is 80 μm, and the array pitch is 200 μm. Insulator films (not shown) having an aperture diameter of 80 μm are respectively interposed between the upper and middle electrodes 1 and 2 and between the middle and lower electrodes 2 and 3.

A method of fabricating the electron optical system array 10 having this structure will be explained. For descriptive convenience, only one aperture will be exemplified.

This fabrication method includes the step of forming an upper structure containing the upper electrode 1 and part of the shield 4, the step of forming a lower structure containing the lower electrode 3 and part of the shield 4, the step of forming a middle structure containing the middle electrodes 2 and part of the shield 4, and the step of joining the upper, middle, and lower structures to complete the electron optical system array.

The steps of fabricating upper and lower structures will be described. In the first embodiment, the upper and lower structures are identical and are formed by the same method. Alternatively, they may be formed by different methods.

Figure 2A:
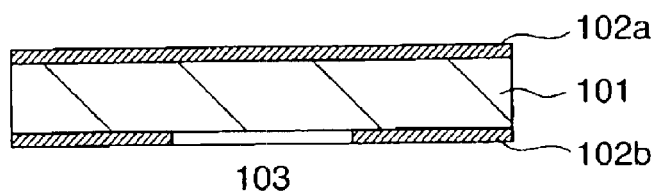
FIGS. 2A to 2G are sectional views for explaining a method of fabricating an upper electrode (lower electrode) and shield.
Figure 2B:
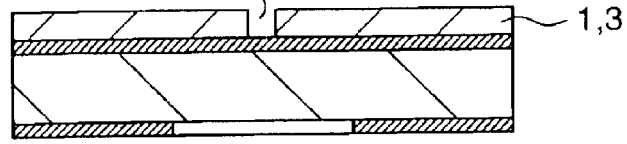
Figure 2C:
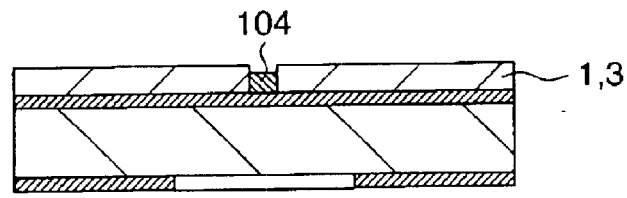

A silicon wafer of the <100> orientation is prepared as a substrate 101, and 300-nm thick silicon nitride films 102a and 102b are formed on the upper and lower surfaces of the substrate 101 by CVD (Chemical Vapor Deposition). A portion of the lower silicon nitride film 102b that serves as a prospective optical path of an electron beam is removed by resist and etching processes (FIG. 2A). Chromium and gold films are successively deposited to film thicknesses of 50 nm and 10 μm as an upper electrode 1 (3), and a resist pattern is formed on them. The gold and chromium films are etched using this resist pattern as a mask, thereby forming an aperture 103 for transmitting an electron beam (FIG. 2B). An SiO₂ film 104 is formed in the aperture 103 by sputtering and patterning (FIG. 2C).

Figure 2D:
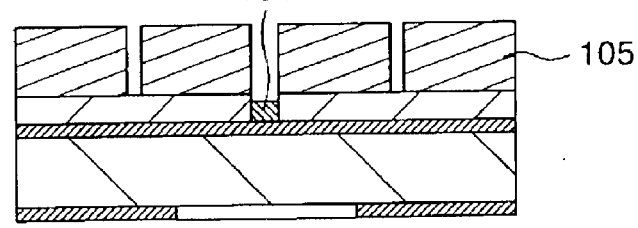

A resist pattern 105 serving as a plating mold is formed on the electrode 1 (3). In this case, the resist is made of SU-8 (MicroChem. Co) mainly consisting of an epoxidized bisphenol A oligomer, and is formed to a film thickness of 110 μm. Exposure of the mold pattern uses a contact type exposure apparatus using a high-pressure mercury lamp. After pattern exposure, post-exposure bake (PEB) is done for the substrate on a hot plate at 85° C. for 30 min. After the substrate is gradually cooled to room temperature, the resist is developed with propylene glycol monomethyl ether acetate for 5 min to complete the plating mold pattern 105 (FIG. 2D).

Figure 2E:
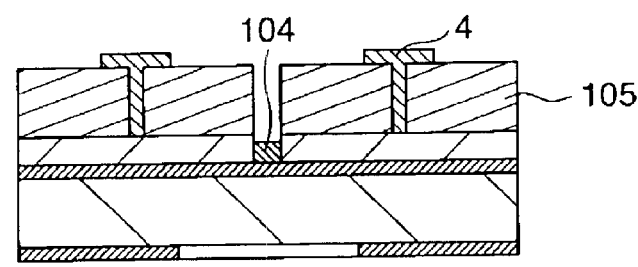
Figure 2F:
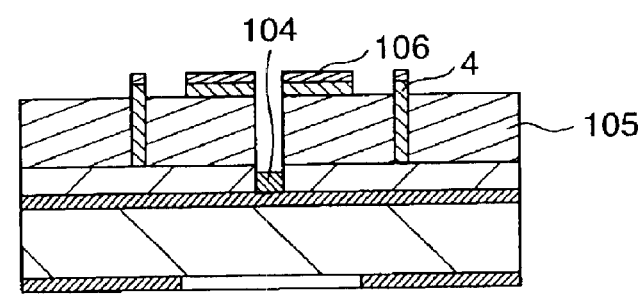

The electrode 1 (3) is used as a plating electrode, and Au which forms part of the shield 4 is buried by electroplating to a thickness larger than the resist thickness in the resist pattern 105 (FIG. 2E). The SU-8 resist 105 and shield 4 are partially polished until the thicknesses of the SU-8 resist 105 and shield 4 reach 100 μm. A 0.5 μm-thick Au layer 106 is formed by vapor deposition and patterning for the purpose of contact bonding in a post-process (FIG. 2F).

Figure 2G:
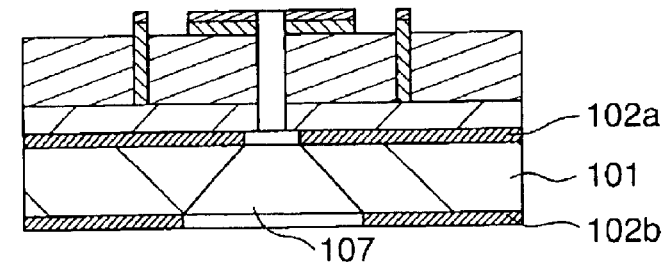

The plating surface (upper surface) is protected with polyimide (not shown). Then, the substrate 101 is etched back from the other surface (lower surface) at 90° C. by using a 22% aqueous tetramethylammonium hydroxide solution, thus forming an aperture 107. Etching is continued until silicon is etched away and the silicon nitride film 102$a$ below the electrode 1 (3) is exposed. The substrate is cleaned with water and dried. The silicon nitride film 102$a$ exposed after dry etching of silicon and the SiO$_2$ film 104 buried in the aperture 103 are etched away by using tetrafluoromethane in a dry etching apparatus. The polyimide film which protects the other surface is removed by ashing (FIG. 2G).

Figure 3A:
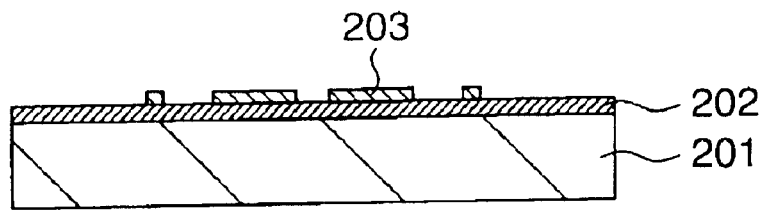
FIGS. 3A to 3D are sectional views for explaining a method of fabricating a middle electrode.
Figure 3B:
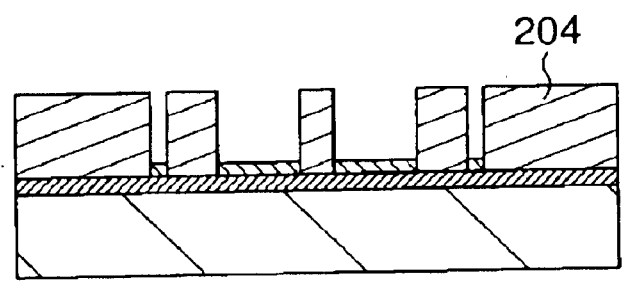
Figure 3C:
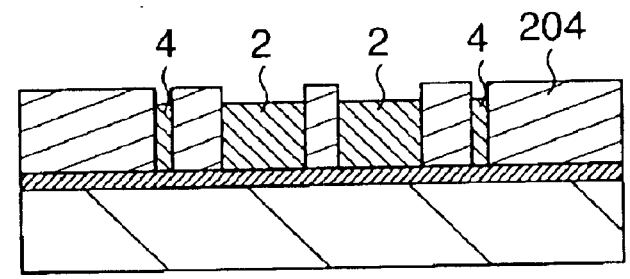
Figure 3D:
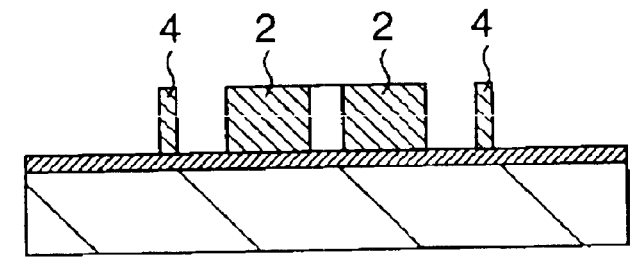

The middle structure is fabricated as follows. A silicon wafer is prepared as a substrate 201, and an SiO$_2$ film 202 is formed to a thickness of 50 nm by sputtering. A plating electrode film 203 for fabricating the middle electrode 2 and shield 4 is formed by depositing gold to a film thickness of 50 nm and patterning it (FIG. 3A). A resist pattern 204 serving as a plating mold is formed. The resist is made of SU-8 (MicroChem. Co) mainly consisting of an epoxidized bisphenol A oligomer, and is formed to a film thickness of 70 $\mu$m. Exposure of the mold pattern uses a contact type exposure apparatus using a high-pressure mercury lamp. After exposure, post-exposure bake (PEB) is done for the substrate on a hot plate at 85° C. for 30 min. After the substrate is gradually cooled to room temperature, the resist is developed with propylene glycol monomethyl ether acetate for 5 min to complete the plating mold pattern 204 (FIG. 3B). A 50-$\mu$m thick gold pattern is buried as the middle electrode 2 and shield 4 in gaps of the resist pattern 204 by electroplating (FIG. 3C). The SU-8 resist pattern 204 is removed in N-methylpyrrolidone (NMP), and the substrate is cleaned and dried by IPA (FIG. 3D).

A method of joining the upper, middle, and lower structures will be explained with reference to FIGS. 4A to 4D. A middle structure 320 fabricated by the method shown in FIGS. 3A to 3D is turned over and pressed against a lower structure 310 fabricated by the method shown in FIGS. 2A to 2G (FIG. 4A). A portion consists of the substrate 201 and SiO$_2$ film 202 is removed from the pressed structure (FIG. 4B). A gold film 106/4 of the lower structure 310 and a gold film 2/4 of the middle structure 320 are joined by contact bonding. The adhesive properties between the SiO$_2$ film 202 and the gold film 2/4 of the middle structure 320 are poorer than contact bonding between the gold films, so that the substrate 201 and SiO$_2$ film 202 can be removed from the pressed structure. An upper structure 330 fabricated by the method shown in FIGS. 2A to 2G is turned over and pressed against the resultant structure (FIG. 4C). Accordingly, the gold films are contact-bonded to each other, and a high-precision multi-electron lens is completed (FIG. 4D).

In the electron optical system array 10 having this arrangement, the upper electrode 1, lower electrode 3, and shield 4 receive a potential of 0 [V], a middle electrode 2 on a given line receives a potential of −1,000 [V], a middle electrode 2 on another line receives a potential of −950 [V], and the adjacent potential difference is set to 50 [V]. At this time, the beam deflection angle $\Delta\theta$ is almost 0, and generation of crosstalk is suppressed to a negligible degree.

Figure 5:
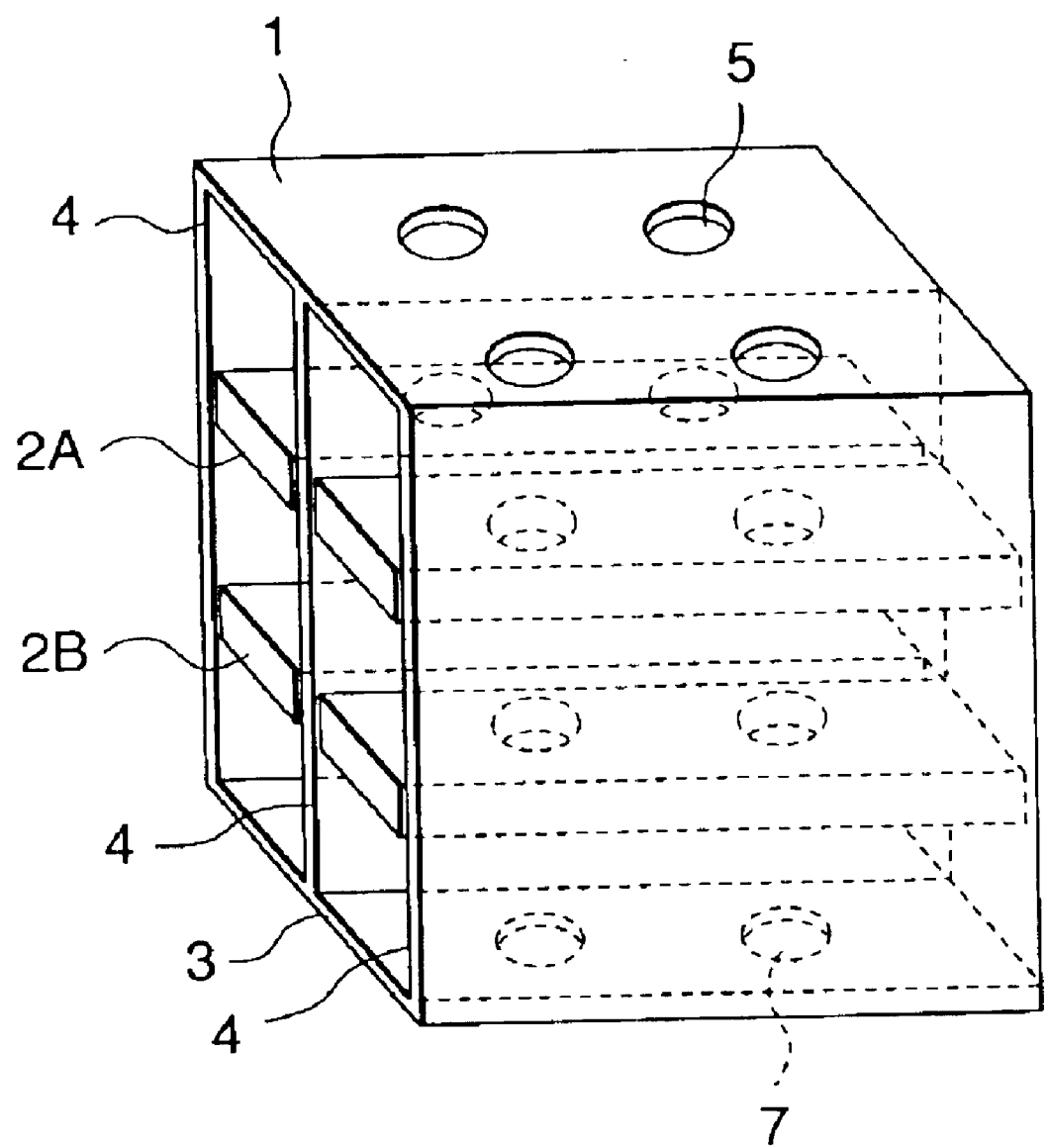
FIG. 5 is a perspective view showing the structure of a modification of the electron optical system array.

In the first embodiment, the einzel lens is comprised of three types of electrodes, i.e., the upper electrode 1, middle electrodes 2, and lower electrode 3 arranged along the optical axis (electron beam path). As a modification, as shown in FIG. 5, two types of middle electrodes 2 (middle electrodes 2A and 2B) may be arranged along the optical axis, or a larger number of types of middle electrodes may be arranged. In other words, a plurality of middle electrodes may be arranged in at least two planes perpendicular to the optical axis.

Further, the shield 4 may not contact the upper and lower electrodes 1 and 3 instead of physically coupling the upper and lower electrodes 1 and 3 and integrating the shield 4 with them.

FIG. 6 is a perspective view for explaining the arrangement and electrical connection of multiple electron optical system arrays according to the second embodiment. In the second embodiment, the aperture shapes of respective electrodes constituting the multiple electron optical system arrays are a rectangle having one side longer than another side, and two electron optical system arrays are arranged along the optical axis. More specifically, this electron optical system comprises a first electron optical system array 10 having upper, middle, and lower electrodes with rectangular apertures, and a second electron optical system array 11 having upper, middle, and lower electrodes with rectangular apertures. The long side direction of the rectangular aperture of the first electron optical system array 10 is almost perpendicular to that of the second electron optical system array 11 when viewed along the optical axis.

In FIG. 6, an aperture 601 formed in each electrode of the first electron optical system array 10 is a rectangle having a short side in the X-axis direction and a long side in the Y-axis direction when the optical axis direction of an incident electron beam is the Z-axis. To the contrary, an aperture 602 formed in each electrode of the second electron optical system array 11 is a rectangle having a short side in the Y-axis direction and a long side in the X-axis direction.

Figure 7A:
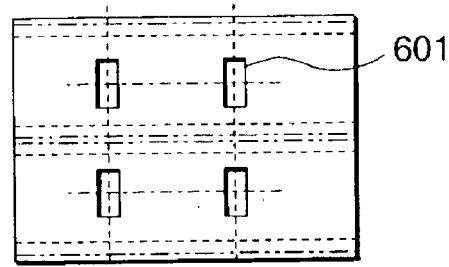
FIGS. 7A to 7D are views for explaining the notation of an electron optical system having an arbitrary aperture angle.
Figure 7B:
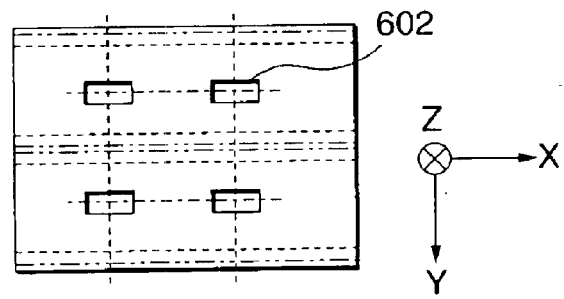
Figure 7C:
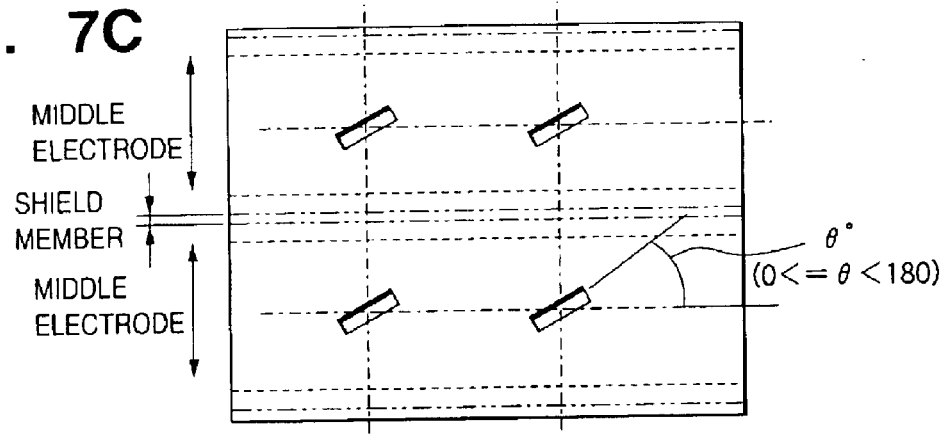
Figure 7D:
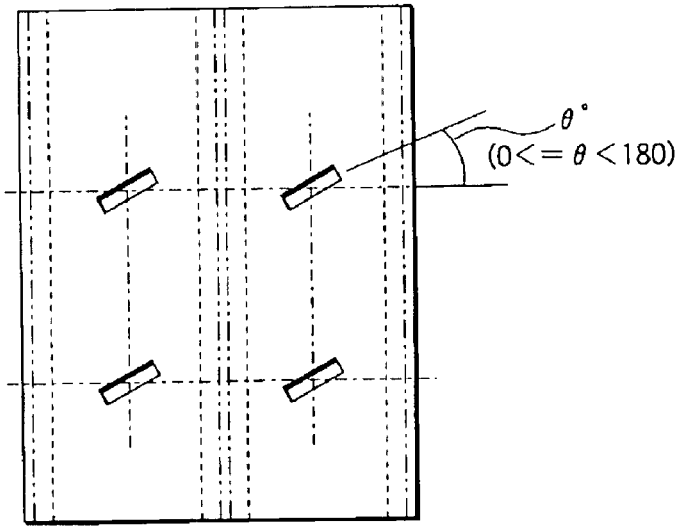
Figure 10:
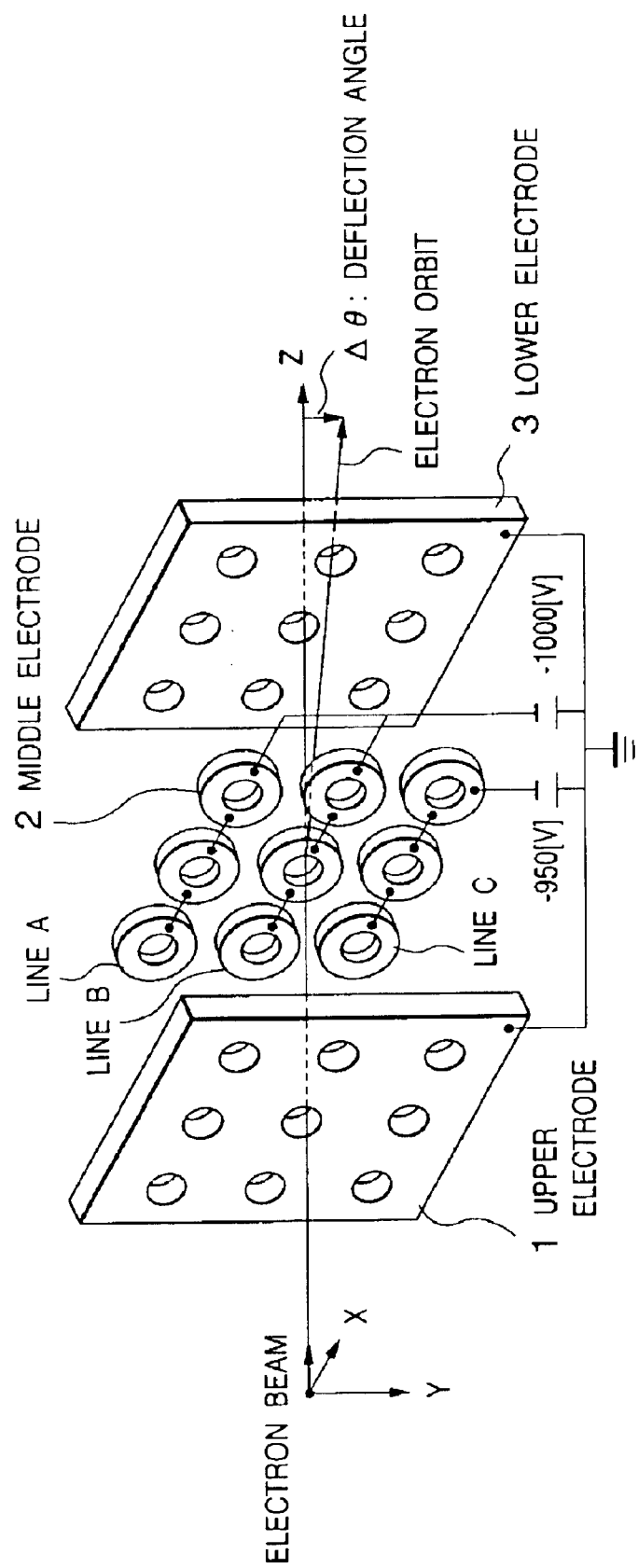
FIG. 10 is a view for explaining generation of crosstalk.

A notation used in the following description is shown in FIGS. 7A to 7D. FIGS. 7A and 7B are plan views of the first and second electron optical system arrays 10 and 11, respectively, when viewed from the incident direction of the electron beam. In FIGS. 7A to 7D, a chain double-dashed line represents the edge of a shield 4, and a broken line represents the edge of a middle electrode 2. FIG. 7C shows all the rectangular apertures 601 in FIG. 7A rotated by $\theta$ ($0°<=\theta<180°$) with reference to the X-axis counterclockwise about the Z-axis. Each rectangular middle electrode has apertures aligned in the X-axis direction, and the rectangular aperture as shown in FIG. 7C is represented as [X$\theta(\theta=N°)$] (N:0<=N<180). In FIG. 7D, the long side (aperture alignment direction) of each rectangular middle electrode 2 coincides with the Y-axis direction, and this rectangular aperture is represented as [Y$\theta(\theta=N°)$] (N:0<=N<180).

According to this notation, the first and second electron optical system arrays 10 and 11 in FIG. 6 are respectively represented by [X$\theta(\theta=90°)$] and [X$\theta(\theta=0°)$]. An electron lens of X$\theta(\theta=90°)$ has a beam convergence effect in the X-axis direction, whereas an electron lens of X$\theta(\theta=0°)$ has a beam convergence effect in the Y-axis direction. For example, if a circular beam whose section is smaller than a rectangular aperture passes through the lens of X$\theta(\theta=0°)$, the beam having passed through it converges in the Y direction, as shown in FIG. 8. According to the second embodiment in which the two electron optical system arrays 10 and 11 are arranged apart from each other along the optical axis so as to make their convergence directions perpendicular to each other, an electron beam having passed through these electron optical systems converges in both the X and Y directions. For example, the aperture size of the electrode is set to 80×200 $\mu$m; the width of the middle electrode, 500 $\mu$m; and the aperture pitch, 600 $\mu$m. The electron lenses of X$\theta(\theta=90°)$ and X$\theta(\theta=0°)$ are disposed apart by 600 $\mu$m. These arrays are electrically connected as shown in FIG. 6. A potential of −1,000 [V] is applied to one of the middle electrodes of each of the first and second electron optical system arrays 10 and 11, and a potential of −950 [V] is applied to the other middle electrode. An incident electron beam (50 kV, 20 $\mu$m in diameter) attains a deflection angle of almost 0° in the Y-axis direction after passing through the electron optical system shown in FIG. 6.

Accordingly, a multi-electron lens almost free from crosstalk can be implemented. Since rectangular apertures are laid out perpendicularly to each other, the convergence effect can be obtained in both the X and Y directions. Also in the second embodiment, each of the electron optical system arrays 10 and 11 can employ a plurality of middle electrodes, similar to FIG. 5.

FIG. 9 shows multiple electron optical system arrays according to the third embodiment. In the third embodiment, electron optical system arrays 12 and 13 of X$\theta$ ($\theta$=45°) and X$\theta$ ($\theta$=135°) are added to the two electron optical system arrays 10 and 11 of X$\theta$ ($\theta$=90°) and X$\theta$ ($\theta$=0°) described in the second embodiment, and a total of four electron optical system arrays 10 to 13 are arranged along the optical axis. The lens of $\theta$ ($\theta$=45°) has a beam convergence effect in the direction of $\theta$=135°, while the lens of $\theta$ ($\theta$=135°) has a beam convergence effect in the direction of $\theta$=45°. The convergence effect acts from four rotation-symmetrical directions, which is the same as the action of an astigmatism correction lens used in a general electron beam apparatus. Hence, divergence of a beam represented by 12 in FIG. 8 is suppressed, and a highly converged electron beam can be obtained. Also, in the third embodiment, each electron optical system array can employ a plurality of middle electrodes, similar to the embodiment shown in FIG. 5, or a lens may be constituted by n (n>=3) electrodes. The number of electron optical system units is not limited to four, arbitrary N stages (N>=1) can be adopted, and the number of stages can be determined in accordance with the allowable value of correction aberration.

<Electron Beam Exposure Apparatus>

Figure 11:
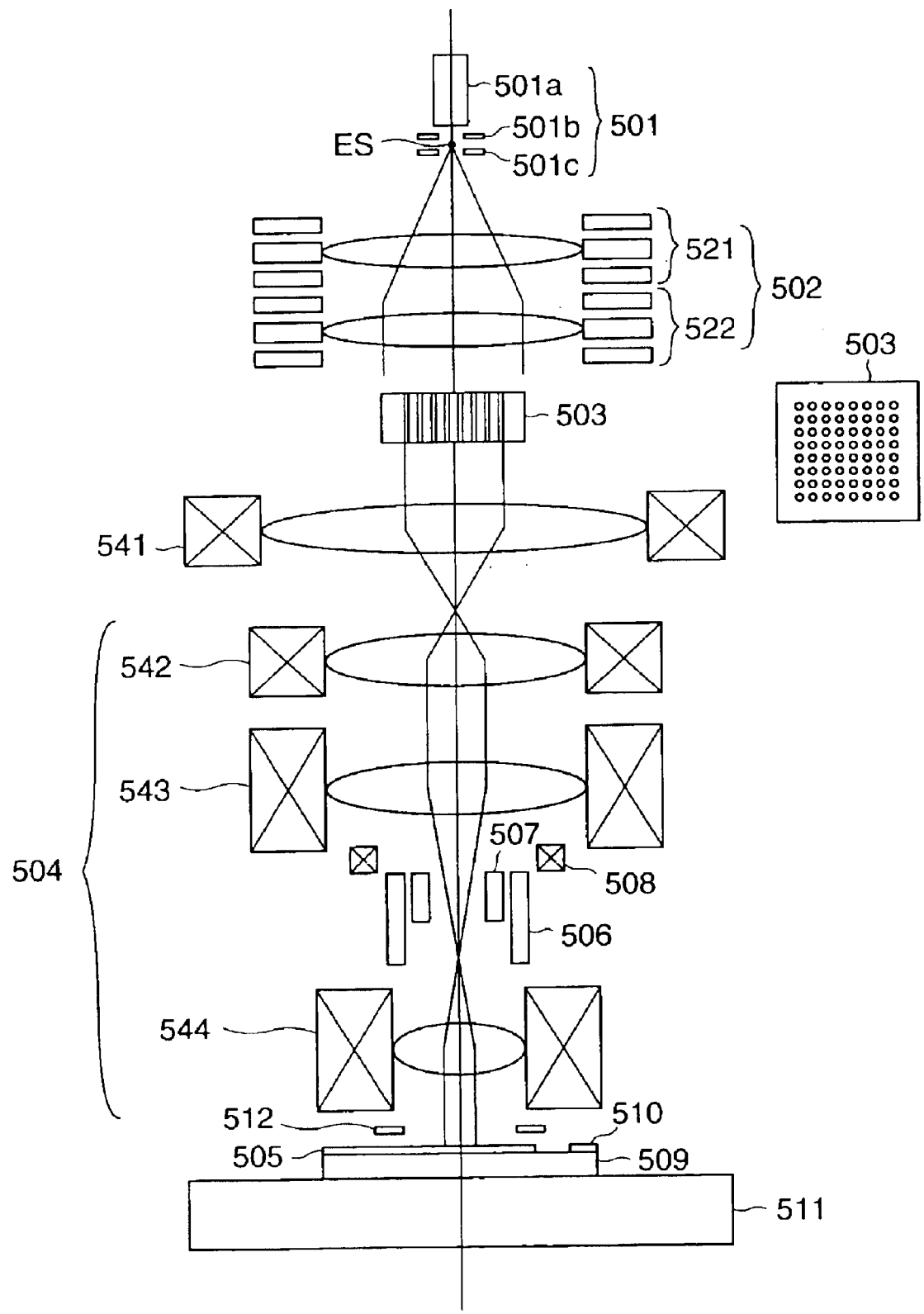
FIG. 11 is a view showing an entire multi-beam exposure apparatus.

A multi-beam charged-particle exposure apparatus (electron beam exposure apparatus) will be exemplified as a system using a single or multiple electron optical system arrays as described in the first to third embodiments. FIG. 11 is a schematic view showing the overall system. In FIG. 11, an electron gun 501 as a charged-particle source is constituted by a cathode 501*a*, grid 501*b*, and anode 501*c*. Electrons emitted from the cathode 501*a* form a crossover image (to be referred to as an electron source ES hereinafter) between the grid 501*b* and the anode 501*c*. An electron beam emitted from the electron source ES irradiates a correction electron optical system 503 via an irradiation electron optical system 502 serving as a condenser lens. The irradiation electron optical system 502 is comprised of electron lenses (einzel lenses) 521 and 522 each having three aperture electrodes. The correction electron optical system 503 includes an electron optical system array to which the single or multiple electron optical system arrays are applied, and forms a plurality of intermediate images of the electron source ES (details of the structure will be described later). The correction electron optical system 503 adjusts the formation positions of intermediate images so as to correct the influence of aberration of a projection electron optical system 504. Each intermediate image formed by the correction electron optical system 503 is reduced and projected by the projection electron optical system 504, and forms an image of the electron source ES on a wafer 505 as a surface to be exposed. The projection electron optical system 504 is constituted by a symmetrical magnetic doublet made up of a first projection lens 541 (543) and second projection lens 542 (544). Reference numeral 506 denotes a deflector for deflecting a plurality of electron beams from the correction electron optical system 503 and simultaneously displacing a plurality of electron source images on the wafer 505 in the X and Y directions; 507, a dynamic focus coil for correcting a shift in the focal position of an electron source image caused by deflection aberration generated when the deflector 506 operates; 508, a dynamic stigmatic coil for correcting astigmatism among deflection aberrations generated by deflection; 509, a $\theta$-Z stage which supports the wafer 505, is movable in the optical axis AX (Z-axis) direction and the rotational direction around the Z-axis, and has a stage reference plate 510 fixed thereto; 511, an X-Y stage which supports the $\theta$-Z stage and is movable in the X and Y directions perpendicular to the optical axis AX (Z-axis); and 512, a reflected-electron detector for detecting reflected electrons generated upon irradiating a mark on the stage reference plate 510 with an electron beam.

Figure 12A:
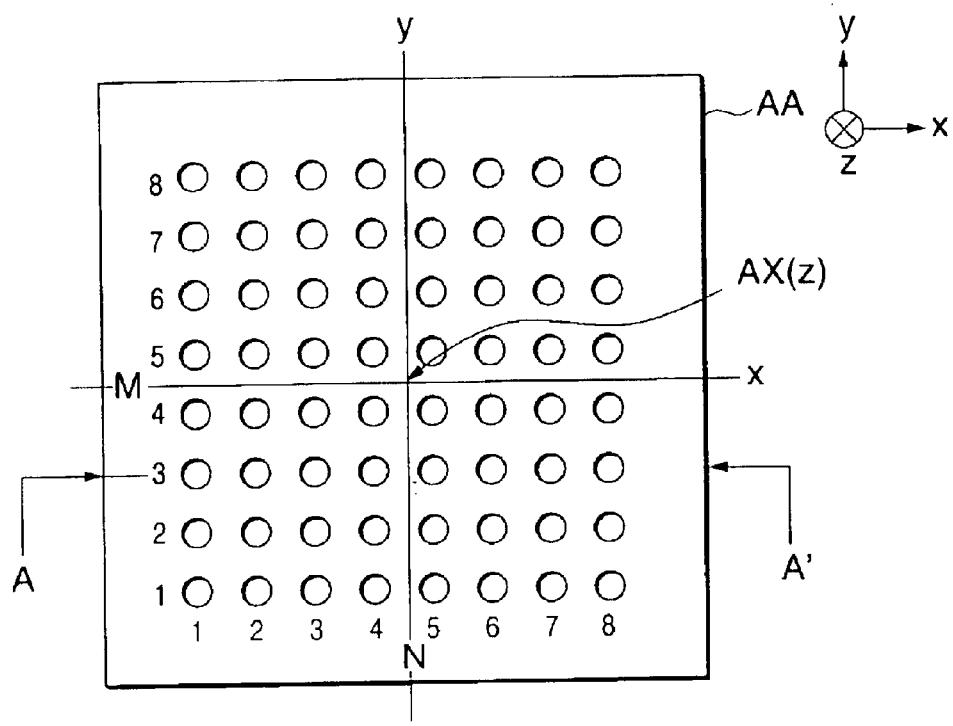
FIGS. 12A and 12B are views for explaining details of a correction electron optical system.
Figure 12B:
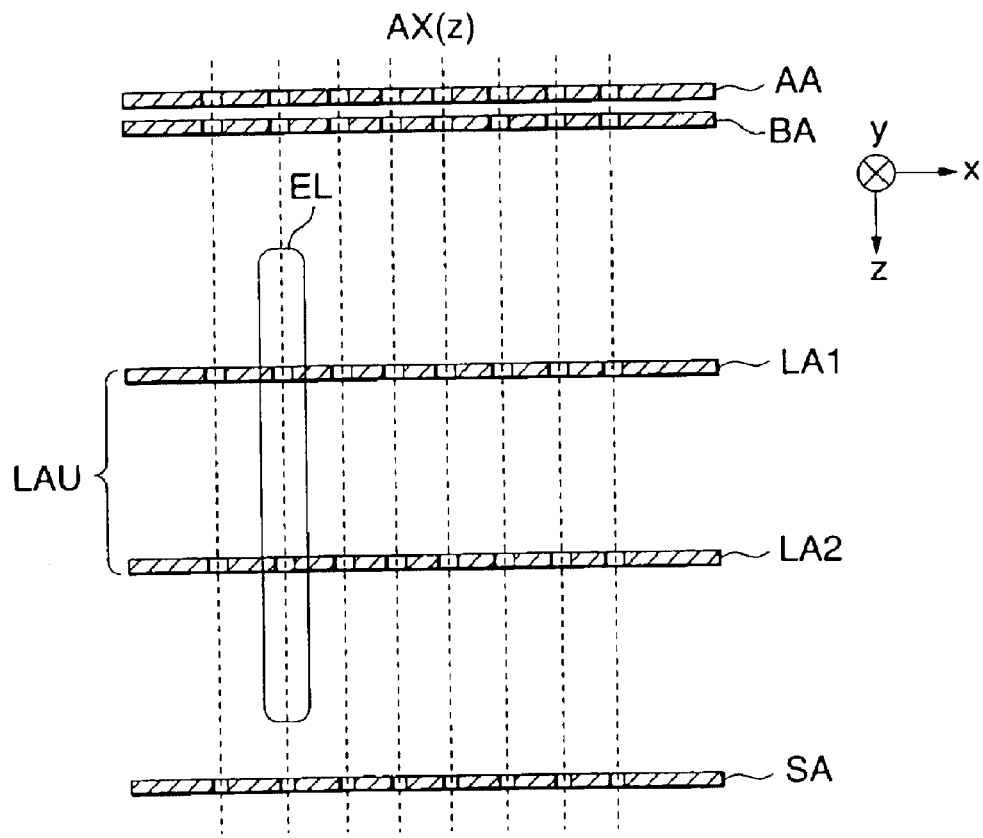

FIGS. 12A and 12B are views for explaining details of the correction electron optical system 503. The correction electron optical system 503 comprises an aperture array AA, blanker array BA, element electron optical system array LAU, and stopper array SA along the optical axis. FIG. 12A is a view of the correction electron optical system 503 when viewed from the electron gun 501, and FIG. 12B is a sectional view taken along the line A-A'in FIG. 12A. As shown in FIG. 12A, the aperture array AA has an array (8×8) of apertures regularly formed in a substrate, and splits an incident electron beam into a plurality of (64) electron beams. The blanker array BA is constituted by forming on one substrate a plurality of deflectors for individually deflecting a plurality of electron beams split by the aperture array AA. The element electron optical system array unit LAU is formed from first and second electron optical system arrays LA1 and LA2 as electron lens arrays each prepared by two-dimensionally arraying a plurality of electron lenses on the same plane. The electron optical system arrays LA1 and LA2 have a structure as an application of the single or multiple electron optical system arrays described in the above embodiments to an 8×8 array. The first and second electron optical system arrays LA1 and LA2 are fabricated by the above-mentioned method. The element electron optical system array unit LAU constitutes one element electron optical system EL by the electron lenses of the first and second electron optical system arrays LA1 and LA2 that use the common X-Y coordinate system. The stopper array SA has a plurality of apertures formed in a substrate, similar to the aperture array AA. Only a beam deflected by the blanker array BA is shielded by the stopper array SA, and ON/OFF operation of an incident beam to the wafer 505 is switched for each beam under the control of the blanker array.

Since the charged-particle beam exposure apparatus of this embodiment adopts an excellent electron optical system array as described above for the correction electron optical system, an apparatus having a very high exposure precision can be provided and can increase the integration degree of a device to be manufactured in comparison with the prior art.

<Example of A Semiconductor Production System>

A production system for a semiconductor device (e.g., a semiconductor chip such as an IC or LSI, a liquid crystal panel, a CCD, a thin-film magnetic head, a micromachine, or the like) using the exposure apparatus will be exemplified. A trouble remedy or periodic maintenance of a manufacturing apparatus installed in a semiconductor manufacturing factory, or maintenance service such as software distribution is performed by using a computer network outside the manufacturing factory.

Figure 13:
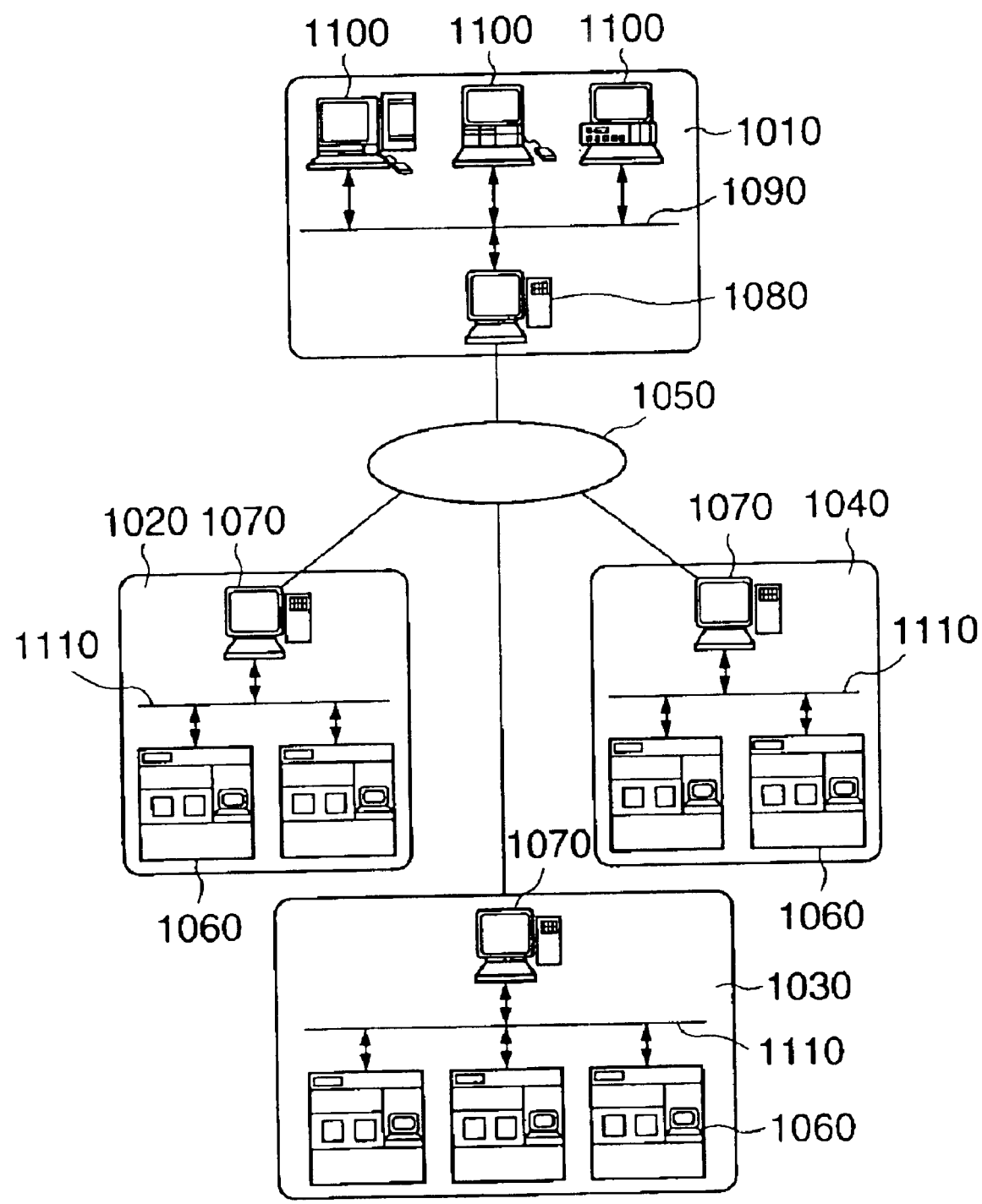
FIG. 13 is a view showing the concept of a semiconductor device production system when viewed from a given angle.

FIG. 13 shows the overall system cut out at a given angle. In FIG. 13, reference numeral 1010 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 1010 comprises a host management system 1080 for providing a maintenance database for the manufacturing apparatus, a plurality of operation terminal computers 1100, and a LAN (Local Area Network) 1090, which connects the host management system 1080 and computers 1100 to construct an intranet. The host management system 1080 has a gateway for connecting the LAN 1090 to Internet 1050 as an external network of the business office, and a security function for limiting external access.

Reference numerals 1020 to 1040 denote manufacturing factories of the semiconductor manufacturer as users of manufacturing apparatuses. The manufacturing factories 1020 to 1040 may belong to different manufacturers or the same manufacturer (e.g., a pre-process factory, a post-process factory, and the like). Each of the factories 1020 to 1040 is equipped with a plurality of manufacturing apparatuses 1060, a LAN (Local Area Network) 1110, which connects these apparatuses 1060 to construct an intranet, and a host management system 1070 serving as a monitoring apparatus for monitoring the operation status of each manufacturing apparatus 1060. The host management system 1070 in each of the factories 1020 to 1040 has a gateway for connecting the LAN 1110 in the factory to the Internet 1050 as an external network of the factory. Each factory can access the host management system 1080 of the vendor 1010 from the LAN 1110 via the Internet 1050. Typically, the security function of the host management system 1080 authorizes access of only a limited user to the host management system 1080.

In this system, the factory notifies the vendor via the Internet 1050 of status information (e.g., the symptom of a manufacturing apparatus in trouble) representing the operation status of each manufacturing apparatus 1060. The vendor transmits, to the factory, response information (e.g., information designating a remedy against the trouble, or remedy software or data) corresponding to the notification, or maintenance information such as the latest software or help information. Data communication between the factories 1020 to 1040 and the vendor 1010 and data communication via the LAN 1110 in each factory typically adopt a communication protocol (TCP/IP) generally used in the Internet. Instead of using the Internet as an external network of the factory, a dedicated-line network (e.g., an ISDN) having high security, which inhibits access of a third party, can be adopted. It is also possible that the user constructs a database in addition to one provided by the vendor and sets the database on an external network and that the host management system authorizes access to the database from a plurality of user factories.

Figure 14:
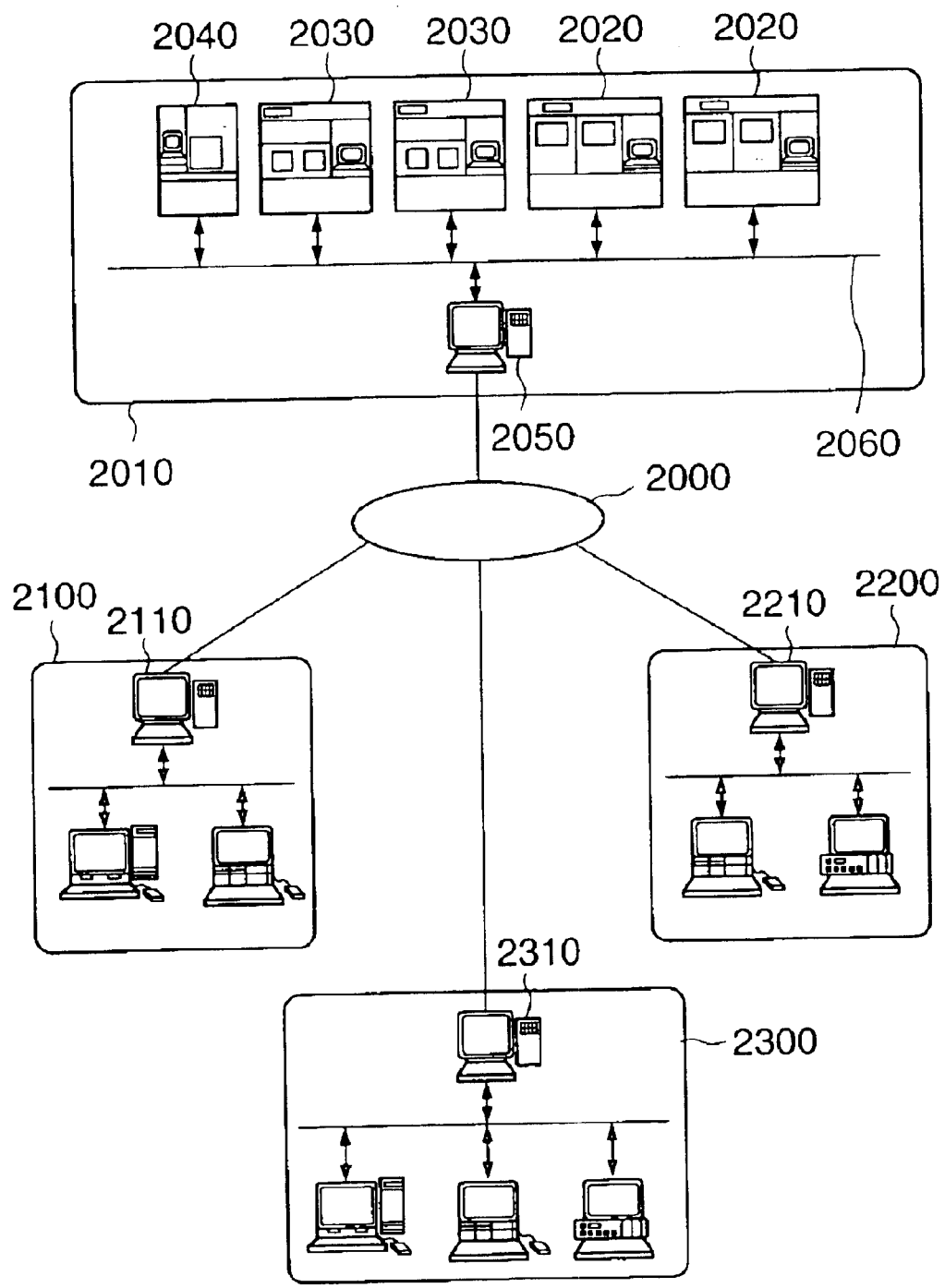
FIG. 14 is a view showing the concept of the semiconductor device production system when viewed from another angle.

FIG. 14 is a view showing the concept of the overall system of this embodiment that is cut out at a different angle from FIG. 13. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 14, a factory having a plurality of manufacturing apparatuses of a plurality of vendors, and the management systems of the vendors of these manufacturing apparatuses are connected via the external network of the factory, and maintenance information of each manufacturing apparatus is communicated. In FIG. 14, reference numeral 2010 denotes a manufacturing factory of a manufacturing apparatus user (semiconductor device manufacturer) where manufacturing apparatuses for performing various processes, e.g., an exposure apparatus 2020, a resist processing apparatus 2030, and a film formation apparatus 2040 are installed in the manufacturing line of the factory. FIG. 14 shows only one manufacturing factory 2010, but a plurality of factories are networked in practice. The respective apparatuses in the factory are connected to a LAN 2060 to construct an intranet, and a host management system 2050 manages the operation of the manufacturing line. The business offices of vendors (apparatus supply manufacturers) such as an exposure apparatus manufacturer 2100, a resist processing apparatus manufacturer 2200, and a film formation apparatus manufacturer 2300 comprise host management systems 2110, 2210 and 2310 for executing remote maintenance for the supplied apparatuses. Each host management system has a maintenance database and a gateway for an external network, as described above. The host management system 2050 for managing the apparatuses in the manufacturing factory of the user, and the management systems 2110, 2210, and 2310 of the vendors of the respective apparatuses are connected via the Internet or dedicated-line network serving as an external network 2000. If trouble occurs in any one of a series of manufacturing apparatuses along the manufacturing line in this system, the operation of the manufacturing line stops. This trouble can be quickly solved by remote maintenance from the vendor of the apparatus in trouble via the external network 2000. This can minimize stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 15 on the display. While referring to this window, the operator who manages manufacturing apparatuses in each factory inputs, in input items on the windows, pieces of information such as the type of manufacturing apparatus (4010), serial number (4020), subject of trouble (4030), occurrence date (4040), degree of urgency (4050), symptom (4060), remedy (4070), and progress (4080). The pieces of input information are transmitted to the maintenance database via the Internet, and appropriate maintenance information is sent back from the maintenance database and displayed on the display. The user interface provided by the web browser realizes hyperlink functions (4100 to 4120), as shown in FIG. 15. This allows the operator to access detailed information of each item, receive the latest-version software to be used for a manufacturing apparatus from a software library provided by a vendor, and receive an operation guide (help information) as a reference for the operator in the factory.

Figure 16:
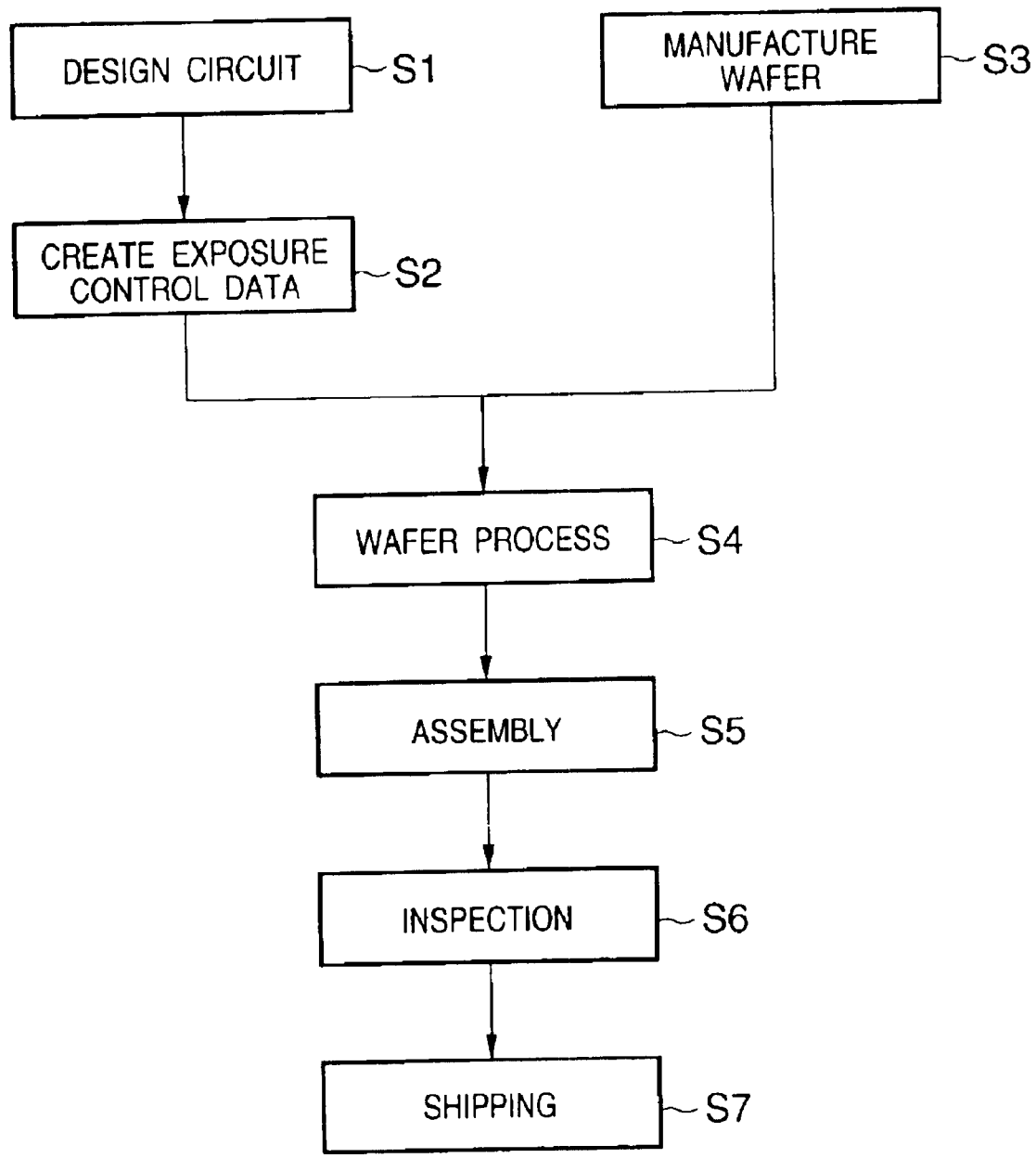
FIG. 16 is a flow chart for explaining the flow of a semiconductor device manufacturing process.

A semiconductor device manufacturing process using the above-described production system will be explained. FIG. 16 shows the flow of the whole manufacturing process of the semiconductor device. In step 1 (circuit design), a semiconductor device circuit is designed. In step 2 (creation of exposure control data), exposure control data of the exposure apparatus is created based on the designed circuit pattern. In step 3 (wafer manufacture), a wafer is manufactured using a material such as silicon. In step 4 (wafer process), called a pre-process, an actual circuit is formed on the wafer by lithography using a prepared mask and the wafer. Step 5 (assembly), called a post-process, is the step of forming a semiconductor chip by using the wafer manufactured in step 4, and includes an assembly process (dicing and bonding) and a packaging process (chip encapsulation). In step 6 (inspection), inspections such as the operation confirmation test and a durability test of the semiconductor device manufactured in step 5 are conducted. After these steps, the semiconductor device is completed and shipped (step 7). For example, the pre-process and post-process may be performed in separate dedicated factories. In this case, maintenance is done for each of the factories by the above-described remote maintenance system. Information for production management and apparatus maintenance is communicated between the pre-process factory and the post-process factory via the Internet or dedicated-line network.

Figure 17:
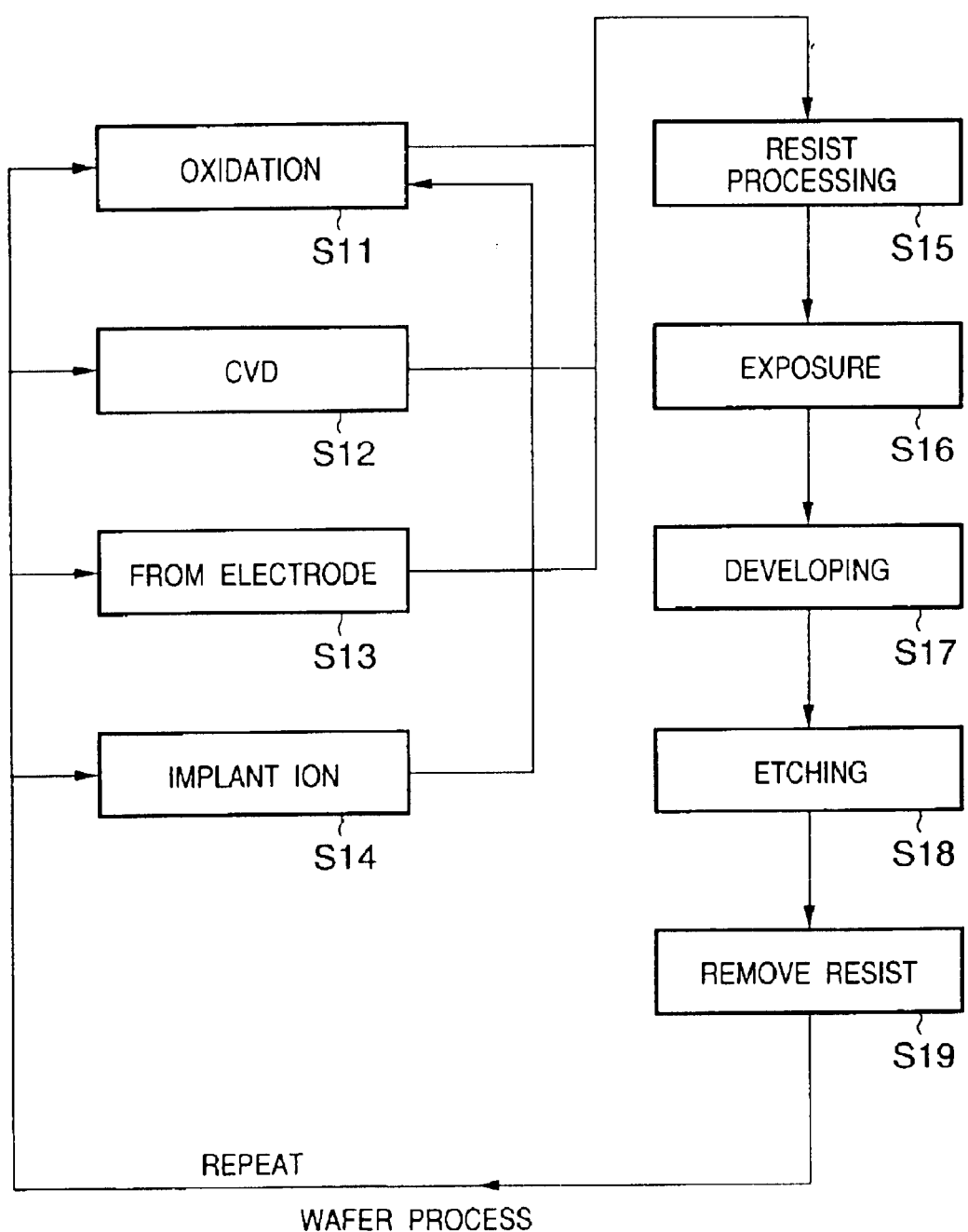
FIG. 17 is a flow chart for explaining details of a wafer process.

FIG. 17 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus draws (exposes) a circuit pattern on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

The present invention can provide an electron optical system array which solves crosstalk unique to a multi-beam and realizes various conditions such as downsizing, high precision, and high reliability at high level. The present invention can also provide a high-precision exposure apparatus using the electron optical system array, a high-productivity device manufacturing method, a semiconductor device production factory, and the like.

As many apparently widely different embodiments of the present invention can be made without departing from the spirit and scope thereof, it is to be understood that the invention is not limited to the specific embodiments thereof except as defined in the appended claims.

What is claimed is:

1. An electron optical system having a plurality of electron lenses, said system comprising:

a first electron optical system array having electrodes with a plurality of rectangular apertures; and a second electron optical system array having electrodes with a plurality of rectangular apertures, said first and second electron optical system arrays being arranged along an optical axis, wherein a long side of each aperture of said first electron optical system array is perpendicular to a long side of each aperture of said second electron optical system array.

2. The system according to claim 1, wherein each of said first and second electron optical system arrays comprises:

an upper electrode having a plurality of apertures;

a plurality of middle electrodes each having an aperture;

a lower electrode having a plurality of apertures; and a shield interposed between said adjacent middle electrodes.

3. A charged-particle beam exposure apparatus comprising:

a charged-particle source for emitting a charged-particle beam;

a first electron optical system which has a plurality of electron lenses and forms a plurality of intermediate images of said charged-particle source by the plurality of electron lenses; and a second electron optical system for projecting on a substrate the plurality of intermediate images formed by said first electron optical system, said first electron optical system including:

a first electron optical system array having electrodes with a plurality of rectangular apertures; and a second electron optical system array having electrodes with a plurality of rectangular apertures, said first and second electron optical system arrays being arranged along an optical axis, wherein a long side of each aperture of said first electron optical system array is perpendicular to a long side of each aperture of said second electron optical system array.

4. An electron optical system having a plurality of electron lenses, the system comprising:

a plurality of electrodes which have rectangular apertures for transmitting a charged-particle beam and are arranged in one plane; and a shield interposed between adjacent electrodes.

5. An electron optical system having a plurality of electron lenses, the system comprising:

an upper electrode having a plurality of rectangular apertures;

a plurality of middle electrodes each having a rectangular aperture;

a lower electrode having a plurality of rectangular apertures; and a shield interposed between adjacent middle electrodes, wherein said upper electrode, middle electrodes, and lower electrode are arranged along an optical axis.

6. The system according to claim 5, wherein each of said middle electrodes has a plurality of rectangular apertures, and a long side of each aperture has an angle of not less than 0° to less than 180° in a direction along which the plurality of apertures are aligned.

7. An electron optical system for a charged-particle beam, the system comprising:

a substrate having a plurality of apertures for transmitting the charged-particle beam and a plurality of electrodes; and a conductive shield interposed between adjacent electrodes.

8. The system according to claim 7, wherein the conductive shield is arranged to prevent influence of a field generated by the electrode from transmitting between one side of the conductive shield and another side of the conductive shield.

9. The system according to claim 7, wherein the conductive shield extends in a direction substantially parallel to a transmission direction of the charged-particle beam.

10. The system according to claim 7, wherein the conductive shield is insulated from the adjacent electrodes.

11. The system according to claim 7, wherein a space or an insulator is provided between the adjacent electrodes.

12. The system according to claim 7, wherein the apertures are circular or rectangular.

13. An electron optical system including a plurality of electron lenses, the system comprising:

upper and lower substrates each having a plurality of apertures for transmitting a charged-particle beam;

a plurality of middle substrates each having at least one aperture for transmitting the charged-particle beam and at least one electrode, the plurality of middle substrates being arranged between the upper substrate and the lower substrate in a transmission direction of the charged-particle beam; and a conductive shield interposed between adjacent middle substrates.

14. The system according to claim 13, wherein the conductive shield is electrically coupled to the upper substrate and the lower substrate.

15. The system according to claim 13, wherein a plurality of apertures are arrayed in the middle substrate.

16. An exposure apparatus which performs patterning using a charged-particle beam, the apparatus comprising:

a charged-particle beam source for emitting a charged-particle beam; and an electron optical system including a substrate having a plurality of apertures for transmitting the charged-particle beam and a plurality of electrodes, and a conductive shield interposed between adjacent electrodes.

17. A device manufacturing method comprising the steps of:

performing a patterning process on a sample using an exposure apparatus defined in claim 16; and developing the sample subjected to the patterning process.

18. An exposure apparatus which performs patterning using a charged-particle beam, the apparatus comprising:

a charged-particle beam source for emitting a charged-particle beam; and an electron optical system including upper and lower substrates each having a plurality of apertures for transmitting the charged-particle beam, a plurality of middle substrates each having at least one aperture for transmitting the charged-particle beam and at least one electrode and arranged between the upper substrate and the lower substrate in a transmission direction of the charged-particle beam, and a conductive shield interposed between adjacent middle substrates.

19. A device manufacturing method comprising the steps of:

performing a patterning process on a sample using an exposure apparatus defined in claim 18; and developing the sample subjected to the patterning process.

* * * * *

UNITED STATES PATENT AND TRADEMARK OFFICE
CERTIFICATE OF CORRECTION

PATENT NO. : 6,903,345 B2
DATED : June 7, 2005
INVENTOR(S) : Haruhito Ono et al.

It is certified that error appears in the above-identified patent and that said Letters Patent is hereby corrected as shown below:

Title page,
Item [56], References Cited, U.S. PATENT DOCUMENTS,
"6,381,072 B1  4/2002  Burger.....................359/622" should be deleted and the following inserted therefor:
-- 6,381,702 B1 4/2002  Ogasawara .......................713/500 --; and
"2001/0008207 A1      1/2002  Muraki et al. .....................250/398" should read
-- 2002/0008207 A1      1/2002  Muraki et al. .....................250/398 --.

Drawings,
Sheet 17, FIG. 17, in step S13, "FROM" should read -- FORM --.

Column 2,
Line 8, "80-$\mu$m" should read -- 80 $\mu$m --.

Column 10,
Line 20, "A-A'in" should read -- A-A' in --.

Signed and Sealed this

Twenty-seventh Day of September, 2005

JON W. DUDAS
*Director of the United States Patent and Trademark Office*

UNITED STATES PATENT AND TRADEMARK OFFICE
CERTIFICATE OF CORRECTION

PATENT NO. : 6,903,345 B2
DATED : June 7, 2005
INVENTOR(S) : Haruhito Ono et al.

It is certified that error appears in the above-identified patent and that said Letters Patent is hereby corrected as shown below:

Title page,
Item [56], References Cited, U.S. PATENT DOCUMENTS, after
"6,381,072 B1   4/2002  Burger………………...359/622" insert
-- 6,381,702 B1 4/2002  Ogasawara ……………….713/500 --; and
"2001/0008207 A1    1/2002  Muraki et al. ………………..250/398" should read
-- 2002/0008207 A1   1/2002  Muraki et al. ………………..250/398 --.

Drawings,
Sheet 17, FIG. 17, in step S13, "FROM" should read -- FORM --.

Column 2,
Line 8, "80-$\mu$m" should read -- 80 $\mu$m --.

Column 10,
Line 20, "A-A′in" should read -- A-A′ in --.

This certificate supersedes Certificate of Correction issued September 27, 2005.

Signed and Sealed this

Fourteenth Day of February, 2006

JON W. DUDAS
*Director of the United States Patent and Trademark Office*